(12) United States Patent
Moon et al.

(10) Patent No.: US 9,887,080 B2
(45) Date of Patent: Feb. 6, 2018

(54) METHOD OF FORMING SIOCN MATERIAL LAYER AND METHOD OF FABRICATING SEMICONDUCTOR DEVICE

(71) Applicant: SAMSUNG ELECTRONICS CO., LTD., Suwon-si, Gyeonggi-do (KR)

(72) Inventors: Kang-hun Moon, Hwaseong-si (KR); Yong-suk Tak, Seoul (KR); Gi-gwan Park, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/372,434

(22) Filed: Dec. 8, 2016

(65) Prior Publication Data

US 2017/0186603 A1 Jun. 29, 2017

(30) Foreign Application Priority Data

Dec. 28, 2015 (KR) .................. 10-2015-0187635

(51) Int. Cl.
*H01L 21/02* (2006.01)
*H01L 29/66* (2006.01)
*H01L 21/28* (2006.01)

(52) U.S. Cl.
CPC .... *H01L 21/02126* (2013.01); *H01L 21/0228* (2013.01); *H01L 21/02208* (2013.01); *H01L 21/02274* (2013.01); *H01L 21/28247* (2013.01); *H01L 29/6656* (2013.01); *H01L 29/66795* (2013.01); *H01L 21/02211* (2013.01); *H01L 21/02214* (2013.01); *H01L 21/02219* (2013.01)

(58) Field of Classification Search
CPC ......... H01L 21/02126; H01L 21/02211; H01L 21/02219; H01L 21/2236; H01L 21/31612; H01L 29/66795; H01L 21/02532; H01L 21/3145; H01L 21/823864; H01L 29/6656
See application file for complete search history.

(56) References Cited

U.S. PATENT DOCUMENTS

| | | | |
|---|---|---|---|
| 5,783,495 | A | 7/1998 | Li et al. |
| 6,291,299 | B1 | 9/2001 | Chu |
| 6,410,462 | B1 | 6/2002 | Yang et al. |
| 6,566,281 | B1 | 5/2003 | Buchanan et al. |
| 6,638,365 | B2 | 10/2003 | Ye et al. |
| 6,716,770 | B2 | 4/2004 | O'Neill et al. |
| 6,960,516 | B1 | 11/2005 | Inagaki |
| 7,098,150 | B2 | 8/2006 | Misra et al. |
| 7,129,184 | B2 | 10/2006 | Chang et al. |

(Continued)

FOREIGN PATENT DOCUMENTS

| | | |
|---|---|---|
| JP | 2012-140700 A | 7/2012 |
| KR | 10-0672934 B1 | 1/2007 |
| KR | 10-1149811 B1 | 7/2012 |

*Primary Examiner* — Eliseo Ramos Feliciano
*Assistant Examiner* — Joannie A Garcia
(74) *Attorney, Agent, or Firm* — Lee & Morse, P.C.

(57) ABSTRACT

A method of forming a SiOCN material layer and a method of fabricating a semiconductor device are provided, the method of forming a SiOCN material layer including supplying a silicon source onto a substrate; supplying a carbon source onto the substrate; supplying an oxygen source onto the substrate; and supplying a nitrogen source onto the substrate, wherein the silicon source includes a non-halogen silylamine, a silane compound, or a mixture thereof.

19 Claims, 22 Drawing Sheets

(56) References Cited

U.S. PATENT DOCUMENTS

| | | |
|---|---|---|
| 7,132,353 B1 | 11/2006 | Xia et al. |
| 7,344,999 B2 | 3/2008 | Mun et al. |
| 7,473,655 B2 | 1/2009 | Wang et al. |
| 7,482,286 B2 | 1/2009 | Misra et al. |
| 7,553,761 B2 | 6/2009 | Kim et al. |
| 7,625,609 B2 | 12/2009 | Matsuura |
| 7,704,897 B2 | 4/2010 | Mungekar et al. |
| 7,964,441 B2 | 6/2011 | Joe et al. |
| 8,304,351 B2 | 11/2012 | Wang et al. |
| 8,329,262 B2 | 12/2012 | Miller et al. |
| 8,357,430 B2 | 1/2013 | Dussarrat et al. |
| 8,445,078 B2 | 5/2013 | Liang |
| 8,449,942 B2 | 5/2013 | Liang et al. |
| 8,466,049 B2 | 6/2013 | Inokuchi et al. |
| 8,466,073 B2 | 6/2013 | Wang et al. |
| 8,563,445 B2 | 10/2013 | Liang et al. |
| 8,592,328 B2 | 11/2013 | Hausmann et al. |
| 8,629,067 B2 | 1/2014 | Liang et al. |
| 8,647,992 B2 | 2/2014 | Liang et al. |
| 8,741,788 B2 | 6/2014 | Liang et al. |
| 8,759,200 B2 | 6/2014 | Francis et al. |
| 8,809,204 B2 | 8/2014 | Akae et al. |
| 9,064,694 B2 | 6/2015 | Consiglio et al. |
| 9,070,555 B2 | 6/2015 | Hausmann et al. |
| 2004/0132257 A1* | 7/2004 | Furuhashi ......... H01L 21/82384 438/299 |
| 2006/0051975 A1 | 3/2006 | Misra et al. |
| 2006/0084281 A1 | 4/2006 | Misra et al. |
| 2006/0121714 A1* | 6/2006 | Ohta ................ H01L 21/28518 438/595 |
| 2007/0010072 A1 | 1/2007 | Bailey et al. |
| 2007/0031598 A1 | 2/2007 | Okuyama et al. |
| 2009/0263972 A1* | 10/2009 | Balseanu ............ H01L 21/3086 438/696 |
| 2010/0081293 A1 | 4/2010 | Mallick et al. |
| 2010/0174103 A1 | 7/2010 | Nakagawa et al. |
| 2011/0136347 A1 | 6/2011 | Kovarsky et al. |
| 2011/0159213 A1 | 6/2011 | Cai et al. |
| 2012/0024223 A1* | 2/2012 | Torres, Jr. ............... C23C 16/24 117/104 |
| 2012/0178267 A1 | 7/2012 | Wang et al. |
| 2012/0213940 A1 | 8/2012 | Mallick |
| 2012/0238108 A1 | 9/2012 | Chen et al. |
| 2013/0149462 A1 | 6/2013 | Liang et al. |
| 2013/0260561 A1* | 10/2013 | Ranjan ............. H01L 21/02112 438/696 |
| 2013/0330935 A1 | 12/2013 | Varadarajan |
| 2014/0287164 A1 | 9/2014 | Xiao et al. |
| 2014/0287595 A1 | 9/2014 | Shimamoto et al. |
| 2014/0329011 A1 | 11/2014 | Wang et al. |
| 2015/0056821 A1 | 2/2015 | Ishikawa et al. |
| 2015/0099375 A1 | 4/2015 | Haripin et al. |
| 2015/0145073 A1* | 5/2015 | Lee .................... H01L 29/6656 257/411 |
| 2015/0147871 A1 | 5/2015 | Xiao et al. |
| 2015/0357440 A1* | 12/2015 | Cheng .............. H01L 29/66795 257/401 |
| 2017/0062584 A1* | 3/2017 | Basker ............. H01L 29/66636 |

* cited by examiner

METHOD OF FORMING SIOCN MATERIAL LAYER AND METHOD OF FABRICATING SEMICONDUCTOR DEVICE

CROSS-REFERENCE TO RELATED APPLICATION

Korean Patent Application No. 10-2015-0187635, filed on Dec. 28, 2015, in the Korean Intellectual Property Office, and entitled: "Method of Forming SiOCN Material Layer and Method of Fabricating Semiconductor Device," is incorporated by reference herein in its entirety.

BACKGROUND

1. Field

Embodiments relate to a method of forming a SiOCN material layer and a method of fabricating a semiconductor device.

2. Description of the Related Art

Resistance against wet etching is a consideration for SiOCN material layers that are used as spacers in a semiconductor device.

SUMMARY

Embodiments are directed to a method of forming a SiOCN material layer and a method of fabricating a semiconductor device.

The embodiments may be realized by providing a method of forming a SiOCN material layer, the method including supplying a silicon source onto a substrate; supplying a carbon source onto the substrate; supplying an oxygen source onto the substrate; and supplying a nitrogen source onto the substrate, wherein the silicon source includes a non-halogen silylamine, a silane compound, or a mixture thereof.

The embodiments may be realized by providing a method of fabricating a semiconductor device, the method including defining a fin-shaped active region on a semiconductor substrate such that the fin-shaped active region protrudes on the semiconductor substrate and extends in a first direction; forming a gate electrode such that the gate electrode surrounds both sidewalls and an upper surface of the fin-shaped active region and extends in a direction intersecting the first direction; forming a gate spacer on side walls of the gate electrode; and forming impurity regions on both sides of the gate electrode, wherein forming the gate spacer includes forming a SiOCN material layer using a non-halogen silylamine, a silane compound, or a mixture thereof as a silicon source.

The embodiments may be realized by providing a method of fabricating a semiconductor device, the method including forming active region on a semiconductor substrate; forming a gate electrode on the active region; forming a gate spacer on side walls of the gate electrode; and forming impurity regions on both sides of the gate electrode, wherein forming the gate spacer includes forming a SiOCN material by supplying a silicon source onto the substrate; and supplying an oxygen source onto the substrate; and wherein the silicon source includes a non-halogen silylamine, a silane compound, or a mixture thereof.

The embodiments may be realized by providing a semiconductor device prepared by performing the method according to an embodiment.

BRIEF DESCRIPTION OF THE DRAWINGS

Features will be apparent to those of skill in the art by describing in detail exemplary embodiments with reference to the attached drawings in which:

FIGS. 8A to 8C illustrate a semiconductor device having a low-dielectric constant material layer on a semiconductor substrate, in which FIG. 8A illustrates a plan view of the semiconductor device, FIG. 8B illustrates a perspective view of the semiconductor device, and FIG. 8C illustrates a lateral cross-sectional view of the semiconductor device;

DETAILED DESCRIPTION

An embodiment provides a method of forming a SiOCN material layer with a halogen group element-free silicon precursor (e.g., non-halogen silicon precursor or non-halogen containing silicon precursor) on a substrate, e.g., a semiconductor substrate. A SiOCN material layer may have a small dielectric constant of less than about 8, and thus may be used as a spacer material for a semiconductor device.

Figure 1:
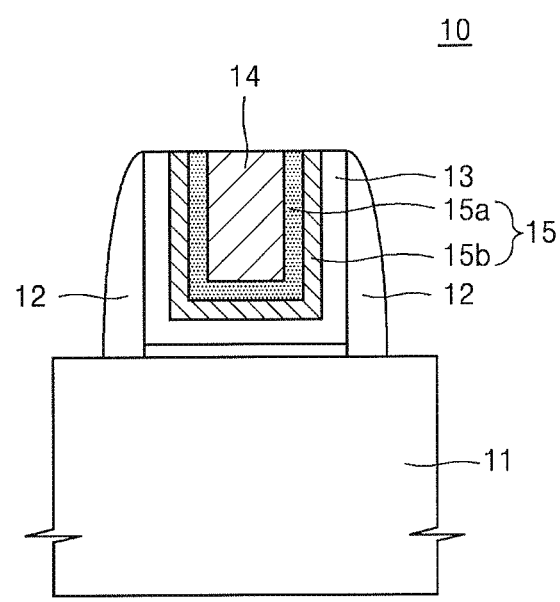
FIG. 1 illustrates a lateral cross-sectional view of a material layer stack including a semiconductor substrate and a SiOCN material layer on the semiconductor substrate, according to an embodiment.

FIG. 1 illustrates a lateral cross-sectional view of a material layer stack 10 including a semiconductor substrate 11 and a SiOCN material layer 12 on the semiconductor substrate 11, according to an embodiment.

Referring to FIG. 1, the semiconductor substrate 11 may be formed of, e.g., at least one of a Groups III and V element-containing material and a Group IV element-containing material. The Groups III and V element-containing material may be a binary, ternary, or quaternary compound including at least one Group III element and at least one Group V element. The Groups III and V element-containing material may be a compound including, e.g., as a Group III element, at least one of In, Ga, and Al, and, as a Group V element, at least one of As, P, and Sb. In an implementation, the Groups III and V element-containing material may be selected from InP, $In_zGa_{1-z}As$ (where $0 \leq z \leq 1$), and $Al_zGa_{1-z}As$ (where $0 \leq z \leq 1$). In an implementation, the binary compound may be one of InP, GaAs, InAs, InSb and GaSb. In an implementation, the ternary compound may be one of InGaP, InGaAs, AlInAs, InGaSb, GaAsSb, and GaAsP. In an implementation, the Group IV element-containing material may include Si and/or Ge.

The Groups III and V element-containing material and the Group IV element-containing material, e.g., Ge, may each be used as a channel material capable of forming a low-power and high-speed transistor. A high-performance CMOS may be formed using a semiconductor substrate formed of a Groups III and V element-containing material, e.g., GaAs, having higher electron mobility than a Si substrate, and a SiGe semiconductor substrate including a semiconductor material, e.g., Ge, having higher hole mobility than a Si substrate. In an implementation, when an N-type channel is to be formed on the semiconductor substrate 11, the semiconductor substrate 11 may be formed of one of the above-exemplified Groups III and V element-containing materials or may be formed of SiC. In an implementation, when a P-type channel is to be formed on the semiconductor substrate 11, the semiconductor substrate 11 may be formed of SiGe.

The SiOCN material layer 12 may include, e.g., about 8 atom % to about 30 atom % of carbon. In an implementation, the SiOCN material layer 12 may include about 8 atom % to about 30 atom % of carbon, as analyzed by X-ray photoelectron spectroscopy (XPS). In an implementation, the SiOCN material layer 12 may include about 11 atom % to about 20 atom % of carbon. Maintaining a sufficiently high carbon content in the SiOCN material layer 12 may help ensure a sufficient etching resistance of the SiOCN material layer 12 to a wet etching agent.

In an implementation, the SiOCN material layer 12 may include, e.g., about 32 atom % to about 50 atom % of oxygen. Maintaining the oxygen content of the SiOCN material layer 12 at about 32 atom % or greater may help ensure a sufficiently low dielectric constant of the SiOCN material layer 12.

In an implementation, a halogen element content of the SiOCN material layer 12 may be, e.g., about 0 atom % to about 0.2 atom %. In an implementation, the halogen element content of the SiOCN material layer 12 may be 0 atom % to about 0.2 atom %, as analyzed by X-ray photoelectron spectroscopy (XPS). In an implementation, no halogen element may be detected through an entire thickness of the SiOCN material layer 12, or a halogen element content of the SiOCN material layer 12 may be greater than 0 atom % and about 0.18 atom % or less. In an implementation, as analyzed by XPS, no halogen element may be detected in the entire thickness of the SiOCN material layer 12, or a halogen element content of the SiOCN material layer 12 may be greater than 0 atom % and about 0.18 atom % or less. If the SiOCN material layer 12 has a halogen element content greater than 0.35 atom %, the SiOCN material layer 12 may have insufficient etching resistance to hydrofluoric acid (HF). If the SiOCN material layer 12 has a halogen element content of 0.35 atom % or less but greater than 0.2 atom %, a large number of defects may occur in eSiGe material layer of source/drain regions. The halogen element may be, e.g., fluorine (F), chlorine (Cl), bromine (Br), or iodine (I).

In an implementation, the SiOCN material layer 12 may have a dielectric constant of, e.g., about 1 to about 8. In an implementation, the SiOCN material layer 12 may have a dielectric constant of about 3.5 to about 5.5, e.g., about 3.5 to about 4.8. Maintaining the dielectric constant of the SioCN material layer 12 at about 8 or less may help ensure that desired electric characteristics are provided. In an implementation, the SiOCN material layer 12 may have a dielectric constant of less than 3.5, but it may not be easy to form a SiOCN material layer having such a low dielectric constant.

The SiOCN material layer 12 may be provided directly on the semiconductor substrate 11 or may be provided over the semiconductor substrate 11 with another material layer interposed between the SiOCN material layer 12 and the semiconductor substrate 11. In an implementation, the SiOCN material layer 12 may be stacked on the semiconductor substrate 11 with an insulation layer therebetween. In an implementation, the SiOCN material layer 12 may be stacked on the semiconductor substrate 11 with an $HfO_2$, $ZrO_2$, HfSiOx, TaSiOx, or LaOx layer therebetween.

In an implementation, the thickness of the SiOCN material layer 12 may not be constant, as illustrated in FIG. 1. In an implementation, the SiOCN material layer 12 may have a substantially constant thickness.

In an implementation, the SiOCN material layer 12 may be formed over a surface of a metal material layer 14 and may be spaced apart from or contact the surface of the metal material layer 14. In an implementation, the metal material layer 14 may include at least one of, e.g., titanium (Ti), tungsten (W), aluminum (Al), ruthenium (Ru), niobium (Nb), hafnium (Hf), nickel (Ni), cobalt (Co), platinum (Pt), ytterbium (Yb), terbium (Tb), dysprosium (Dy), erbium (Er), or palladium (Pd).

In an implementation, the SiOCN material layer 12 may be formed on carbide, nitride, silicide, or aluminum carbide of the metals that constitute the metal material layer 14, or on a combination thereof.

The SiOCN material layer 12 may be formed directly on the metal material layer 14 or may be provided on the metal material layer 14 with a material layer different from the SiOCN material layer 12 therebetween.

In an implementation, the SiOCN material layer 12 may be provided on the surface of the metal material layer 14 with a high-dielectric constant material layer 13 therebetween. In an implementation, the high-dielectric constant material layer 13 may be formed of a material having a dielectric constant of, e.g., about 10 to about 25. In an implementation, the high-dielectric constant material layer 13 may be formed of a material selected from, e.g., hafnium oxide, hafnium oxynitride, hafnium silicon oxide, lanthanum oxide, lanthanum aluminum oxide, lanthanum silicon oxide, zirconium oxide, zirconium silicon oxide, tantalum oxide, tantalum hafnium oxide, tantalum aluminum oxide, tantalum silicon oxide, tantalum zirconium oxide, titanium oxide, titanium aluminum oxide, barium strontium titanium oxide, barium titanium oxide, strontium titanium oxide, yttrium oxide, erbium oxide, dysprosium oxide, gadolinium oxide, gallium oxide, aluminum oxide, aluminum silicon oxide, silicon germanium oxide, lead scandium tantalum oxide, lead zinc niobate, and a combination thereof.

In an implementation, the SiOCN material layer 12 may be provided on the metal material layer 14 with a physical property adjustment functional layer 15 therebetween. The physical property adjustment functional layer 15 may include, e.g., a barrier metal layer 15a and a work function adjustment layer 15b.

The work function adjustment layer 15b may be an N-type or P-type work function adjustment layer. In an implementation, when the work function adjustment layer 15b is an N-type work function adjustment layer, the work function adjustment layer 15b may include a material selected from, e.g., TiAl, TiAlN, TaC, TiC, and HfSi. In an implementation, when the work function adjustment layer 15b is a P-type work function adjustment layer, the work function adjustment layer 15b may include a material selected from, e.g., Mo, Pd, Ru, Pt, TiN, WN, TaN, Ir, TaC, RuN, and MoN.

The barrier metal layer 15a may be, e.g., TiN.

Hereinafter, a method of forming a SiOCN material layer, according to an embodiment will be described.

Figure 2:
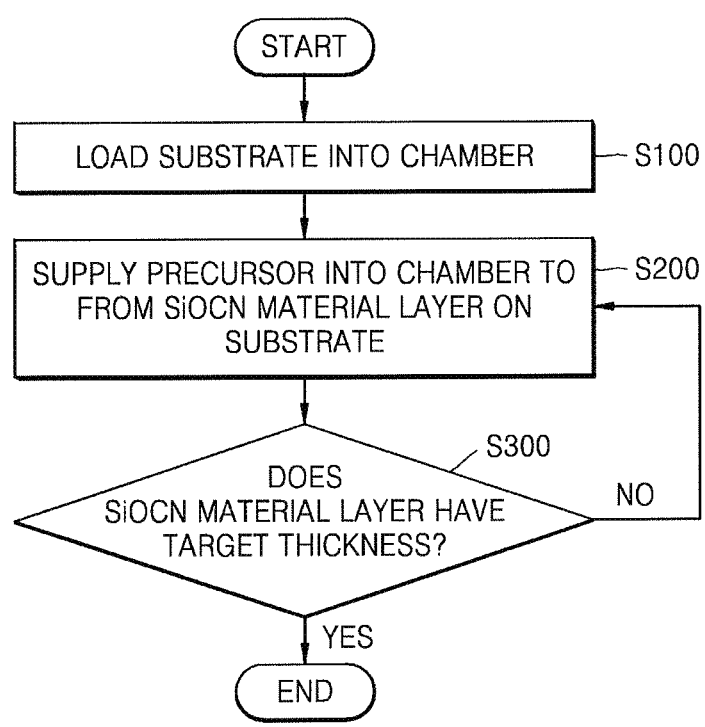
FIG. 2 illustrates a flowchart of a method of forming a SiOCN material layer, according to an embodiment.

FIG. 2 illustrates a flowchart of a method of forming a SiOCN material layer 12 according to an embodiment.

Referring to FIG. 2, a substrate may be loaded into a reaction space such as a chamber, in operation S100. To form a SiOCN material layer on the substrate, source materials or precursors may be supplied into the reaction space, in operation S200. Then, in operation S300, when the SiOCN material layer is formed to a desired thickness, the substrate may be taken out of the reaction space.

Forming the SiOCN material layer on the substrate in operation S200 may be performed by using a suitable method. In an implementation, forming the SiOCN material layer may be performed using chemical vapor deposition (CVD). In an implementation, forming the SiOCN material layer may be performed using atomic layer deposition (ALD). In an implementation forming the SiOCN material layer may be formed using plasma-enhanced atomic layer deposition (PEALD).

Forming the SiOCN material layer on the substrate by PEALD will now be described.

Figure 3:
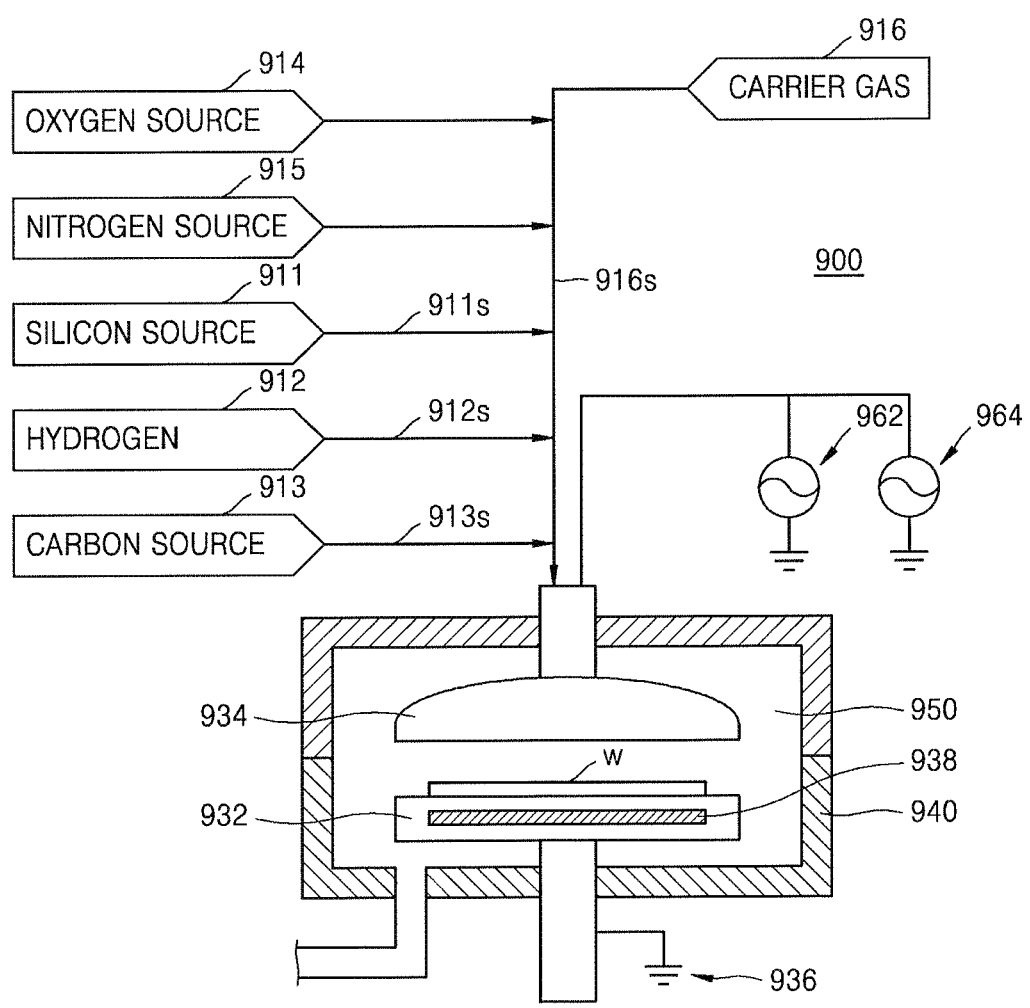
FIG. 3 illustrates a conceptual diagram of a plasma enhanced atomic layer deposition (PEALD) apparatus for forming a SiOCN material layer, according to an embodiment.

FIG. 3 illustrates a conceptual diagram of PEALD equipment 900 for forming a SiOCN material layer, according to an embodiment.

Referring to FIG. 3, a lower electrodes 932 and an upper electrode 934 (as a pair of conductive flat panel electrodes facing each other and extending in parallel) may be provided within a reaction space 950, which is the inside of a reaction chamber 940. 13.56 MHz or 27 MHz HRF power 962 (and LRF power 964 of no more than 5 MHz (400 kHz to 500 kHz) as desired) may be applied to one of the lower and upper electrodes 932 and 934, and the other electrode may be electrically grounded as indicated by reference numeral 936. Thus, plasma may be excited between the lower and upper electrode 932 and 934.

The lower electrode 932 may serve as a support that supports a substrate W, and a temperature adjuster 938 may be built into the lower electrode 932 to maintain the substrate W at a constant temperature. For example, as will be described in detail below, a SiOCN material layer may be able to be deposited with a high oxygen and carbon content at about 400° C. to about 700° C., or even at a relatively low temperature of about 450° C. to about 630° C. Moreover, a SiOCN material layer may be deposited with a high oxygen and carbon content even at a lower temperature, e.g., at about 500° C. or less, according to the type of carbon source used. Accordingly, the temperature adjuster 938 may be configured to adjust a temperature of the substrate W to, e.g., 700° C. or less, 630° C. or less, or 500° C. or less.

The upper electrode 934 may serve as a shower head as well as an electrode. In an implementation, several gases including a process gas may be introduced into the reaction space 950 via the upper electrode 934. In an implementation, some gases may be introduced into the reaction space 950 via respective unique pipes of the gases.

A carrier gas 916 may convey or carry different sources and/or precursors to the reaction space 950. In an implementation, the carrier gas 916 may purge an unreacted material or reaction by-products within the reaction space 950.

The carrier gas 916 may be, e.g., an inert gas such as helium (He) or neon (Ne), or an extremely-low active or nearly unreactive gas such as nitrogen ($N_2$) or carbon dioxide ($CO_2$).

A silicon source 911 may be introduced into the reaction space 950 via a silicon source supply line 911s. At this time, the silicon source supply line 911s may be joined to a carrier gas supply line 916s.

In an implementation, a supply line of the carrier gas 916 may be connected to supply lines of the silicon source 911, hydrogen 912, a carbon source 913, an oxygen source 914, and a nitrogen source 915, as illustrated in FIG. 3. In an implementation, the supply lines may be connected directly to the reaction chamber 940 instead of independently being connected to the supply line of the carrier gas 916. For example, if there is a concern that a gas remaining in a pipe between supply cycles may react with a subsequently supplied material, the supply lines may not be connected to the supply line of the carrier gas 916.

Silicon Source

In an implementation, the silicon source may include, e.g., a non-halogen silylamine, a silane compound (e.g., a non-halogen silane compound different from the non-halogen silylamine), or a mixture thereof. As used herein, the term 'non-halogen' means that a halogen element is not included in the compound. The silicon source may have a molecular weight of, e.g., about 45 to about 500. In an implementation, the silicon source may have a molecular weight of about 80 to about 300.

In an implementation, the non-halogen silylamine may include, e.g., monosilylamine (($SiH_3$)$NH_2$), disilylamine (($SiH_3$)$_2$NH), trisilylamine (($SiH_3$)$_3$N), disilylmethylamine (($SiH_3$)$_2$NMe), disilylethylamine (($SiH_3$)$_2$NEt), disilylisopropylamine (($SiH_3$)$_2$N(iPr)), disilyl-tert-butylamine (($SiH_3$)$_2$N(tBu)), tetrasilyldiamine (($SiH_3$)$_4$$N_2$), diethylsilylamine (($SiH_3$)$NEt_2$), diisopropylsilylamine (($SiH_3$)N(iPr)$_2$), di-tert-butylsilylamine (($SiH_3$)N(tBu)$_2$), bis(trimethylsilyl)amine (($Me_3$Si)$_2$NH), bis(triethylsilyl)amine (($Et_3$Si)$_2$NH), hexamethyldisilazane, hexamethylcyclotrisilazane, heptamethyldisilazane, nomethyltrisilazane, octamethylcyclotetrasilazane, tetramethyldisilazane, 1,1,1,3,3,3-hexamethyldisilazane, 1,1,1,3,3,3-hexaethyldisilazane, 1,1,3,3-tetramethyldisilazane, 1,1,3,3-tetraethyldisilazane, 1,1,1,2,3,3,3-heptamethyldisilazane, 1,1,1,3,3,3-hexaethyl-2-methyldisilazane, 1,1,2,3,3-pentamethyldisilazane, 1,1,3,3-tetraethyl-2-methyldisilazane, 1,1,1,3,3,3-hexamethyl-2-ethyldisilazane, 1,1,1,2,3,3,3-heptaethyldisilazane, 1,1,3,3-tetramethyl-2-ethyldisilazane, 1,1,2,3,3-pentaethyldisilazane, 1,1,1,3,3,3-hexamethyl-2-isopropyldisilazane, 1,1,1,3,3,3-hexaethyl-2-isopropyldisilazane, 1,1,3,3-tetramethyl-2-isopropyldisilazane, 또는 1,1,3,3-tetraethyl-2-isopropyldisilazane, diisopropylaminosilane ($H_3$Si(N(i-Prop)$_2$)), bis(tertiary-butylamino)silane (($C_4H_9$(H)N)$_2$$SiH_2$), tetrakis(dimethylamino)silane (Si($NMe_2$)$_4$), tetrakis(ethylmethylamino)silane (Si($NEtMe$)$_4$), tetrakis(diethylamino)silane (Si($NEt_2$)$_4$), tris(dimethylamino)silane (HSi($NMe_2$)$_3$), tris(ethylmethylamino)silane (HSi($NEtMe$)$_3$), tris(diethylamino)silane (HSi($NEt_2$)$_3$), tris(dimethylhydrazino)silane (HSi(N(H)$NMe_2$)$_3$), bis(diethylamino)silane ($H_2$Si($NEt_2$)$_2$), bis(diisopropylamino)silane ($H_2$Si(N(i-Prop)$_2$)$_2$), tris(isopropylamino)silane (HSi(N(i-Prop)$_2$)$_3$), (diisopropylamino)silane ($H_3$Si(N(i-Prop)$_2$), or any mixtures thereof. In the formulae of the above-listed exemplary non-halogen silylamines, "Me" indicates a methyl group, "Et" indicates an ethyl group, and a "i-Prop" may be an isopropyl group.

In an implementation, the silane compound may be a monosilane compound or a disilane compound. For example, the monosilane compound may have a structure represented by the formula of $SiR^1R^2R^3R^4$, wherein $R^1$, $R^2$, $R^3$, and $R^4$ may be each independently selected from hydrogen, a hydroxyl group, a C1-C10 alkyl group, a C1-C10 alkoxy group, a C2-C10 alkenyl group, a C2-C10 alkynyl group, a C6-C10 aryl group, a C1-C10 monoalkylamino group, a C1-C10 dialkylamino group, and a C1-C10 trialkylamino group, and all of $R^1$, $R^2$, $R^3$, and $R^4$ may not be hydrogen at the same time.

In an implementation, the silane compound (e.g., the non-halogen silane compound) may include, e.g., monomethylsilane, monoethylsilane, dimethylsilane, diethylsilane, trimethylsilane, triethylsilane, tetramethylsilane, tetraethylsilane, tetramethoxysilane, tetraethoxysilane, tetra-n-propoxysilane, tetraisopropoxysilane, tetra-n-butoxysilane, tetra-t-butoxysilane, dimethyldimethoxysilane, dimethyldiethoxysilane, diethyldimethoxysilane, diphenyldimethoxysilane, methyltriethoxysilane, ethyltrimethoxysilane, phenyltriethoxysilane, bis(dimethylamino)dimethylsilane, bis(dimethylamino)methylvinylsilane, bis(ethylamino)dimethylsilane, diethylaminotrimethylsilane, dimethylaminodimethylsilane, tetrakisdimethylaminosilane, tetraisocyanatosilane, tris(dimethylamino)silane, allyldimethylsilane, allyltrimethylsilane, benzyltrimethylsilane, cyclopentadienyltrimethylsilane, phenyldimethylsilane, phenyltrimethylsilane, propargyl trimethylsilane, tetramethylsilane, vinyltrimethylsilane, bis(dimethylamino)silane (BDMAS, $SiH_2(NMe_2)_2$), bis(diethylamino)silane (BDEAS, $SiH_2(NEt_2)_2$), bis(tert-butylamino)silane (BTBAS, $SiH_2(NH(tBu))_2$), diethylaminotriethylsilane, dimethylaminotriethylsilane, ethylmethylaminotriethylsilane, t-butylaminotriethylsilane, isopropylaminotriethylsilane, di-isopropylaminotriethylsilane, diethylaminotrimethylsilane, dimethylaminotrimethylsilane, ethylmethylaminotrimethylsilane, t-butylaminotrimethylsilane, isopropylaminotrimethylsilane, di-isopropylaminotrimethylsilane, diethylaminodimethylsilane, dimethylaminodimethylsilane, ethylmethylaminodimethylsilane, t-butylaminodimethylsilane, isopropylaminodimethylsilane, di-isopropylaminodimethylsilane, diethylaminodiethylsilane, dimethylaminodiethylsilane, ethylmethylaminodiethylsilane, t-butylaminodiethylsilane, isopropylaminodiethylsilane, di-isopropylaminodiethylsilane, bis(diethylamino)dimethylsilane, bis(dimethylamino)dimethylsilane, bis(ethylmethylamino)dimethylsilane, bis(di-isopropylamino)dimethylsilane, bis(isopropylamino)dimethylsilane, bis(tertiary-butylamino)dimethylsilane, bis(diethylamino)diethylsilane, bis(dimethylamino)diethylsilane, bis(ethylmethylamino)diethylsilane, bis(di-isopropylamino)diethylsilane, bis(isopropylamino)diethylsilane, bis(tertiary-butylamino)diethylsilane, bis(diethylamino)methylvinylsilane, bis(dimethylamino)methylvinylsilane, bis(ethylmethylamino)methylvinylsilane, bis(di-isopropylamino) methylvinylsilane, bis(isopropylamino)methylvinylsilane, bis(tertiary-butylamino)methylvinylsilane, tris(dimethylamino)phenylsilane, tris(dimethylamino)methylsilane, tris(dimethylamino)ethylsilane, methoxytrimethylsilane, ethoxytrimethylsilane, iso-propoxytrimethylsilane, t-butoxytrimethylsilane, t-pentoxytrimethylsilane, phenoxy?trimethylsilane, acetoxytrimethylsilane, methoxytriethylsilane, ethoxytriethylsilane, iso-propoxytriethylsilane, t-butoxytriethylsilane, t-pentoxytriethylsilane, phenoxy?triethylsilane, acetoxytriethylsilane, methoxydimethylsilane, ethoxydimethylsilane, iso-propoxydimethylsilane, t-butoxydimethylsilane, t-pentoxydimethylsilane, phenoxy?dimethylsilane, acetoxydimethylsilane, methoxydimethylphenylsilane, ethoxydimethylphenylsilane, iso-propoxydimethylphenylsilane, t-butoxydimethylphenylsilane, t-pentoxydimethylphenylsilane, phenoxy?dimethylphenylsilane, acetoxydimethylphenylsilane, dimethoxydimethylsilane, diethoxydimethylsilane, di-isopropoxydimethylsilane, di-t-butoxydimethylsilane, diacetoxydimethylsilane, dimethoxydiethylsilane, diethoxydiethylsilane, di-isopropoxydiethylsilane, di-t-butoxydiethylsilane, diacetoxydiethylsilane, dimethoxydi-isopropylsilane, diethoxydi-isopropylsilane, di-isopropoxydi-isopropylsilane, di-t-butoxydi-isopropylsilane, diacetoxydi-isopropylsilane, dimethoxymethylvinylsilane, diethoxymethylvinylsilane, di-isopropoxymethylvinylsilane, di-t-butoxymethylvinylsilane, diacetoxymethylvinylsilane, tetraethyl orthosilicate (Si(OCH$_2$CH$_3$)$_4$, TEOS), or any mixtures thereof.

In an implementation, the disilane compound may have a structure represented by the formula of $R^5R^6R^7Si$—$SiR^8R^9R^{10}$, wherein $R^5$, $R^6$, $R^7$, $R^8$, $R^9$, and $R^{10}$ may be each independently selected from hydrogen, a hydroxyl group, a C1-C10 alkyl group, a C1-C10 alkoxy group, a C2-C10 alkenyl group, a C2-C10 alkynyl group, a C6-C10 aryl group, a C1-C10 monoalkylamino group, a C1-C10 dialkylamino group, and a C1-C10 trialkylamino group, and all of $R^5$, $R^6$, $R^7$, $R^8$, $R^9$, and $R^{10}$ may not be hydrogen at the same time.

In an implementation, the disilane compound may include, e.g., monomethyldisilane, dimethyldisilane, 1,1,2,2-tetramethyldisilane, pentamethyldisilane, hexamethyldisilane, hexamethyldisiloxane, hexaethyldisilane, hexapropyldisilane, hexaphenyl disilane, 1,2-diphenyltetramethyldisilane, 1,1,2,2-tetraphenyldisilane, 1,2-diethyl-tetrakis(diethylamino)disilane (($CH_2CH_3$ ($(CH_3CH_2)_2N)_2Si)_2$), hexakis(N-pyrrolidino) disilane ((($C_4H_9N)_3)Si)_2$), 1,2-dimethyltetrakis(diethylamino)disilane (($CH_3(CH_3CH_2N)_2Si)_2$), hexakis(ethylamino)disilane ((($EtHN)_3Si)_2$), 1,2-dimethoxy-1,1,2,2-tetramethyldisilane, 1,2-diethoxy-1,1,2,2-tetramethyldisilane, 1,2-dimethyl-1,1,2,2-tetraphenyldisilane, tris(trimethylsilyl)silane, or any mixtures thereof.

Carbon Source

In an implementation, the carbon source may include, e.g., an alkane having a carbon number of 1 to 10, an alkene having a carbon number of 2 to 10, an alkylamine having a carbon number of 1 to 15, a nitrogen-containing heterocyclic compound having a carbon number of 4 to 15, an alkylsilane having a carbon number of 1 to 20, an alkoxysilane having a carbon number of 1 to 20, or an alkylsiloxane having a carbon number of 1 to 20.

In an implementation, the alkane having a carbon number of 1 to 10 may be, e.g., methane, ethane, propane, butane (all isomers), pentane (all isomers), hexane (all isomers), heptane (all isomers), octane (all isomers), nonane (all isomers), decane (all isomers), or a mixture thereof.

In an implementation, the alkene having a carbon number of 2 to 10 may be, e.g., ethylene, propylene, butene (all isomers), hexene (all isomers), heptene (all isomers), octene (all isomers), nonene (all isomers), decene (all isomers), or a mixture thereof.

In an implementation, the alkylamine having a carbon number of 1 to 15 may have, e.g., the formula $NR^1R^2R^3$. Herein, $R^1$, $R^2$, and $R^3$ may be independently selected from, e.g., hydrogen, a halogen element, an alkyl group having a carbon number of 1 to 10, alkenyl group having a carbon number of 2 to 10, alkylamino group having a carbon number of 1 to 10, aryl group having a carbon number of 6 to 12, arylalkyl group having a carbon number of 7 to 12, alkylaryl group having a carbon number of 7 to 12, and cycloalkyl group having a carbon number of 5 to 12. In an implementation, at least one of $R^1$, $R^2$, and $R^3$ may be an alkyl having a carbon number of 1 to 10. In an implementation, two of $R^1$, $R^2$, and $R^3$ may be connected to each other to form a ring. In an implementation, two or more alkylamines may be connected to each other to form alkyldiamine, alkyltriamine, or the like, and alkyldiamine, alkyltriamine, or the like may belong to the alkylamine having a carbon number of 1 to 15.

In an implementation, the nitrogen-containing heterocyclic compound having a carbon number of 4 to 15 may be, e.g., at least one of compounds having Formula 1 to Formula 8.

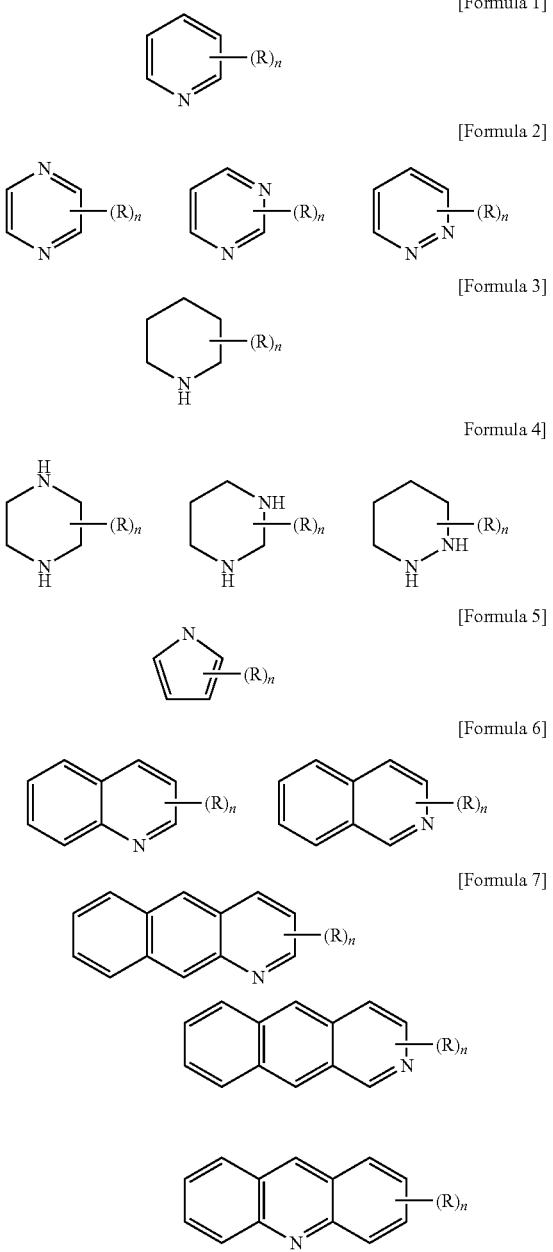

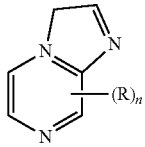
[Formula 8]

In Formulae 1 to 8, n indicates an integer of, e.g., 1 to 4, and R may be selected from, e.g., hydrogen, alkyl having a carbon number of 1 to 10, alkenyl having a carbon number of 2 to 10, aryl having a carbon number of 6 to 12, arylalkyl having a carbon number of 7 to 12, alkylaryl having a carbon number of 7 to 12, and cycloalkyl having a carbon number of 5 to 12.

In an implementation, the alkylsilane having a carbon number of 1 to 20 may have, e.g., the formula $R^1$—$(SiR^2R^3)$n-$R^4$. Herein, n indicates an integer of, e.g., 1 to 12, and $R^1$, $R^2$, $R^3$, and $R^4$ may be independently selected from, e.g., hydrogen, a halogen element, alkyl group having a carbon number of 1 to 10, alkenyl group having a carbon number of 1 to 10, alkylamino group having a carbon number of 1 to 10, aryl having a carbon number of 6 to 12, arylalkyl group having a carbon number of 7 to 12, alkylaryl group having a carbon number of 7 to 12, and cycloalkyl group having a carbon number of 5 to 12. In an implementation, at least one of $R^1$, $R^2$, $R^3$, and $R^4$ includes carbon atoms that are directly combined with Si. In an implementation, $R^1$ and $R^4$ may be connected to each other to form a ring.

In an implementation, the alkoxysilane having a carbon number of 1 to 20 may be a compound in which substituted or unsubstituted alkoxy groups are bonded to a silicon atom at the center, and may have, e.g., the formula $R^1$—$(SiR^2R^3)$n-$R^4$. Herein, n indicates an integer of, e.g., 1 to 12, and $R^1$, $R^2$, $R^3$, and $R^4$ may be independently selected from, e.g., hydrogen, a halogen element, alkyl having a carbon number of 1 to 10, alkoxy having a carbon number of 1 to 10, alkenyl having a carbon number of 1 to 10, alkylamino having a carbon number of 1 to 10, aryl having a carbon number of 6 to 12, arylalkyl having a carbon number of 7 to 12, alkylaryl having a carbon number of 7 to 12, and cycloalkyl having a carbon number of 5 to 12. In an implementation, at least one of $R^1$, $R^2$, $R^3$, and $R^4$ may be alkoxy having a carbon number of 1 to 10, and at least one of $R^1$, $R^2$, $R^3$, and $R^4$ may include carbon atoms that are directly combined with Si. In an implementation, $R^1$ and $R^4$ may be connected to each other to form a ring.

In an implementation, the alkylsiloxane having a carbon number of 1 to 20 may include two or more silicon atoms connected to each other with oxygen atoms therebetween, and may have, e.g., the formula $R^1$—$([SiR^2R^3]$—O)n-$R^4$. Herein, n indicates an integer of, e.g., 2 to 12, and $R^1$, $R^2$, $R^3$, and $R^4$ may be independently selected from, e.g., hydrogen, a halogen element, alkyl having a carbon number of 1 to 10, alkoxy having a carbon number of 1 to 10, alkenyl having a carbon number of 1 to 10, alkylamino having a carbon number of 1 to 10, aryl having a carbon number of 6 to 12, arylalkyl having a carbon number of 7 to 12, alkylaryl having a carbon number of 7 to 12, and cycloalkyl having a carbon number of 5 to 12. In an implementation, at least one of $R^1$, $R^2$, $R^3$, and $R^4$ may include carbon atoms that are directly combined with Si. In an implementation, $R^1$ and $R^4$ may be connected to each other to form a ring.

In an implementation, at least one of alkylsilane having a carbon number of 1 to 20, alkoxysilane having a carbon number of 1 to 20, and alkylsiloxane having a carbon number of 1 to 20 described above may have a molecular weight of about 50 to about 1000. In an implementation, at least one selected from alkylsilane having a carbon number of 1 to 20, alkoxysilane having a carbon number of 1 to 20, and alkylsiloxane having a carbon number of 1 to 20 may have a molecular weight of about 100 to about 400.

Oxygen Source

In an implementation, the oxygen source may include, e.g., $O_3$, $H_2O$ (for example, deionized water, purified water, and/or distilled water), $O_2$, $NO_2$, NO, $N_2O$, $H_2O$, carbon monoxide (CO), carbon dioxide ($CO_2$), an alcohol, a metal alkoxide, plasma $O_2$, remote plasma $O_2$, plasma $N_2O$, plasma $H_2O$, or a combination thereof. The oxygen source may be introduced into the reaction space 950 (see FIG. 3) at a flow rate of, e.g., about 1 sccm to about 2,000 sccm, or about 5 sccm to about 1,000 sccm. A pulse duration time for which the oxygen source is introduced may be about 0.01 seconds to about 100 seconds. The oxygen source may be introduced into the reaction space 950 as a separate oxygen source material or may originate from materials used in deposition processes.

Nitrogen Source

In an implementation, the nitrogen source may include, e.g., $N_2$, $NH_3$, hydrazine ($N_2H_4$), a monoalkylhydrazine, a dialkyllhydrazine, plasma $N_2$, remote plasma $N_2$, or a combination thereof. The nitrogen source may be introduced into the reaction space 950 (FIG. 3) at a flow rate of, e.g., about 1 sccm to about 2,000 sccm, or about 5 sccm to about 1,000 sccm. A pulse duration time for which the nitrogen source is introduced may be about 0.01 seconds to about 100 seconds. The nitrogen source may be introduced into the reaction space 950 as a separate nitrogen source material or may originate from materials used in deposition processes.

A sequence in which the above-described process gases are supplied into the reaction space 950 will now be described.

Figure 4A:
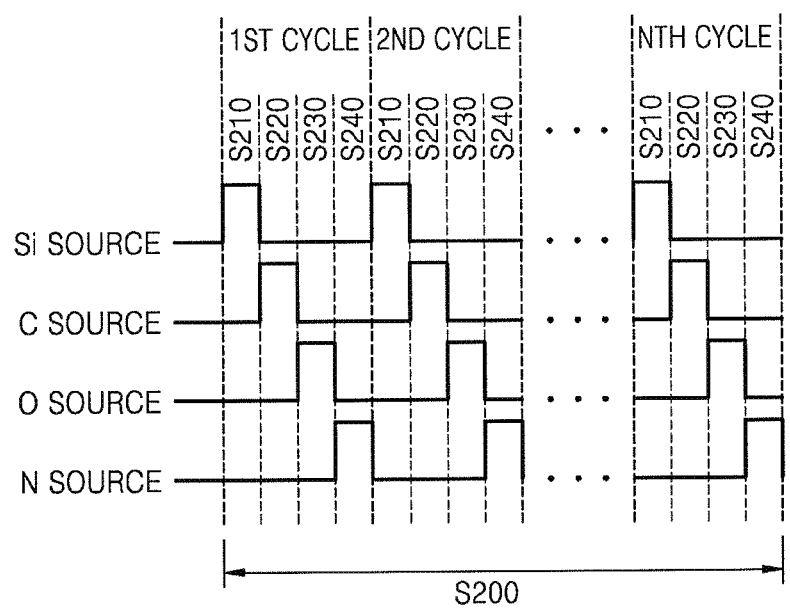
FIG. 4A illustrates a timing diagram of supply cycles of process gases according to an embodiment.
Figure 4B:
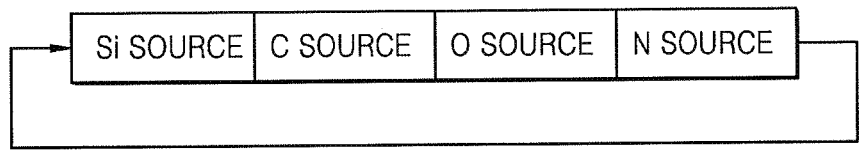
FIG. 4B illustrates a block diagram of a supply sequence of the process gases.

FIG. 4A illustrates a timing diagram of supply cycles of process gases according to an embodiment. FIG. 4B illustrates a block diagram of a supply sequence of the process gases.

Referring to FIGS. 4A and 4B, first, a silicon source may be supplied into a reaction space 950 in operation S210. The silicon source may include, e.g., a halogen-free silicon source material. The silicon source has been described above, and an additional description thereof will be omitted here.

Then, in operations S220, S230, and S240, a carbon source, an oxygen source, and a nitrogen source may be sequentially supplied in this order. In an implementation, a purging process between supplies of source materials may be performed between supplies of source materials. The purge gas may include, e.g., an inert gas such as helium (He), neon (Ne), or argon (Ar), or an extremely-low active gas such as nitrogen ($N_2$) or carbon dioxide ($CO_2$). In an implementation, the purge gas may be supplied into the reaction space 950 at a flow rate of about 10 sccm to about 2,000 sccm or about 0.1 second to about 1,000 seconds. The supplying of the purge gas may also remove any unreacted materials or any byproducts remaining in the reaction space 950.

The operations of supplying the silicon source, the hydrogen, the carbon source, the oxygen source, and the nitrogen source may form a cycle. This cycle may be repeated N times until a SiCON material layer is formed to a desired thickness. For example, N may represent a number of times of performing the cycle after which the desired thickness is achieved.

The operations of supplying the silicon source, the carbon source, the oxygen source, and the nitrogen source may respectively include operations in which the silicon source, the carbon source, the oxygen source, and the nitrogen source are independently activated by plasma. For example, when a chamber temperature is relatively low, energy used for forming a material layer may be supplied by supplying RF power for forming plasma. In an implementation, RF power for forming plasma may be supplied only in one or two of the operations of supplying the silicon source, the carbon source, the oxygen source, and the nitrogen source. In an implementation, RF power for forming plasma may be supplied in all of the operations of supplying the silicon source, the carbon source, the oxygen source, and the nitrogen source.

Figure 5:
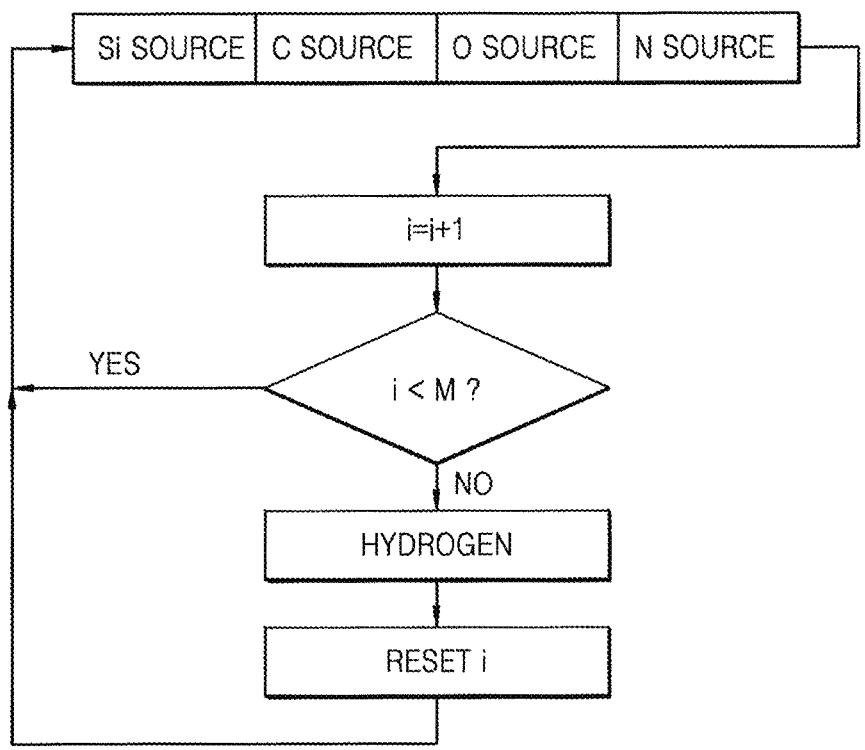
FIG. 5 illustrates a flowchart/block diagram of a supply sequence of process gases, according to an embodiment.

FIG. 5 illustrates a block diagram/flowchart of a supply sequence of process gases, according to an embodiment.

Referring to FIG. 5, a supply cycle of sequentially supplying a silicon source, a carbon source, an oxygen source, and a nitrogen source may be repeated a predetermined number of times (M), wherein M, which indicates the number of times repeating the supply cycle), may be 1 or an integer of 2 or greater. When M is 1, this means that a hydrogen gas may be supplied after each supply cycle of a silicon source, a carbon source, an oxygen source, and a nitrogen source. When M is an integer of 2 or greater, this means that a hydrogen gas may supplied after every two or more supply cycles of a silicon source, a carbon source, an oxygen source, and a nitrogen source. The supply cycle as represented in FIG. 5 may be repeated until a SiOCN material layer having a target thickness is formed.

A reaction to form a SiOCN material layer according to any of the above-described embodiments through the sequential supply of a silicon source, a carbon source, an oxygen source, and a nitrogen source may performed by, e.g., ALD. In an implementation, the SiOCN material layer may be performed by PEALD.

As described above with reference to FIG. 3, the SiOCN material layer may be deposited at a temperature of about 400° C. to about 700° C., e.g., at about 500° C. or less, depending on a type of the carbon source. The treatment with hydrogen as illustrated in FIG. 5 may be performed at a temperature higher than the deposition temperature of the SiOCN material layer, e.g., at about 400° C. to about 700° C.

Figure 6:
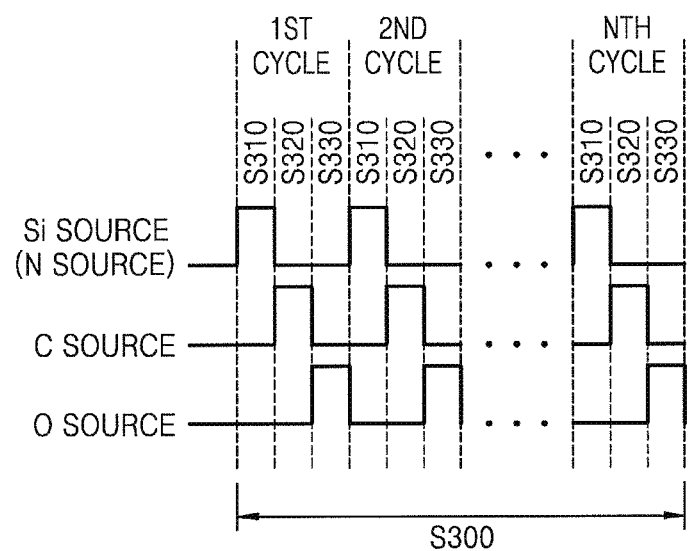
FIGS. 6 and 7 illustrate timing diagrams of supply cycles of process gases according to embodiments.

FIG. 6 illustrates a timing diagram of a supply cycle of process gases, according to another embodiment.

In an implementation, when the silicon source is a silyl amine, the silicon source may also serve as the nitrogen source. This is because a silyl amine includes both silicon and nitrogen atoms. For example, the silicon source may be the same as the nitrogen source.

Referring to FIG. 6, supplying a silicon source and supplying a nitrogen source into the reaction space 950 may be performed at the same time (operation S310). The silicon source may be the same as the nitrogen source.

Subsequently, supplying a carbon source (operation S320) and supplying an oxygen source (operation S330) may be sequentially performed.

As described in the embodiments above with reference to FIGS. 4A and 4B, purging may be performed between the operations of supplying different source materials.

Figure 7:
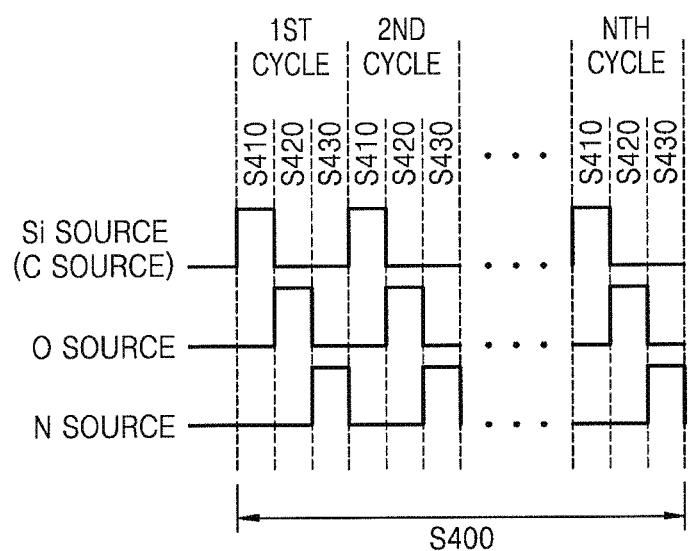

FIG. 7 illustrates a timing diagram of a supply cycle of process gases, according to another embodiment.

In an implementation, when the silicon source is a silane compound having a structure represented by the formula of $SiR^1R^2R^3R^4$ or a disilane compound having a structure represented by the formula of $R^5R^6R^7Si—SiR^8R^9R^{10}$, the silicon source may also serve as a carbon source. This is because such a silane or disilane compound include both silicon and nitrogen atoms. For example, the silicon source may be the same as the carbon source.

Referring to FIG. 7, supplying a silicon source and supplying a carbon source into the reaction space 950 may be performed at the same time (operation S410). The silicon source may be the same as the carbon source.

Subsequently, supplying an oxygen source (operation S420) and supplying a nitrogen source (operation S430) may be sequentially performed.

As described in the embodiments above with reference to FIGS. 4A and 4B, purging may be performed between the operations of supplying different source materials.

When a silicon source also serves as a nitrogen source or a carbon source as described above with reference to FIGS. 6 and 7, the SiOCN material layer may be rapidly formed due to a simplified supply cycle of processes gases.

A semiconductor device including the SiOCN material layer will now be described.

Figure 8A:
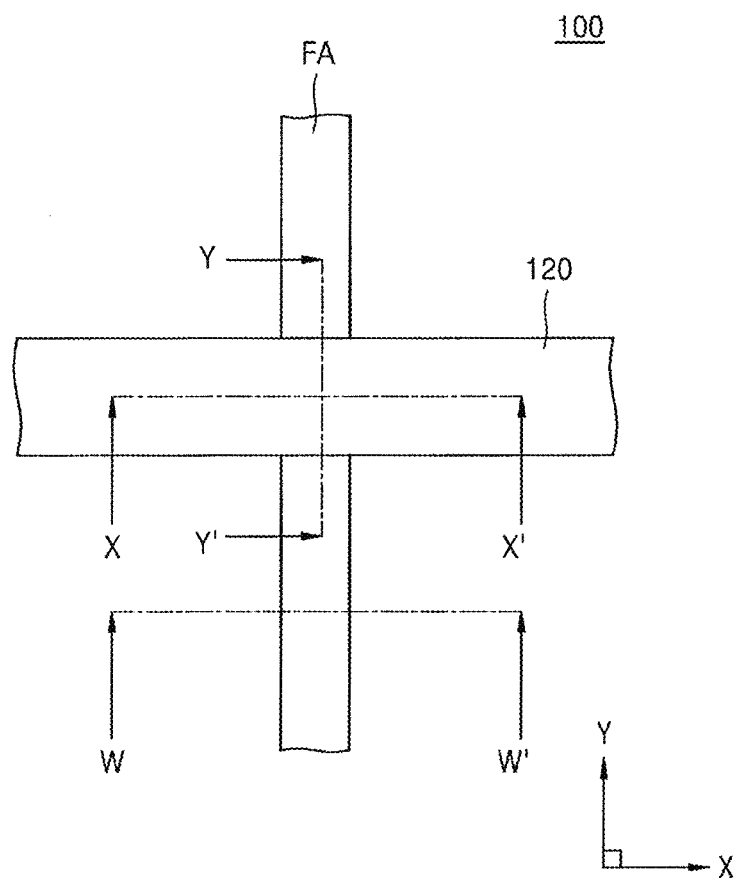
Figure 8B:
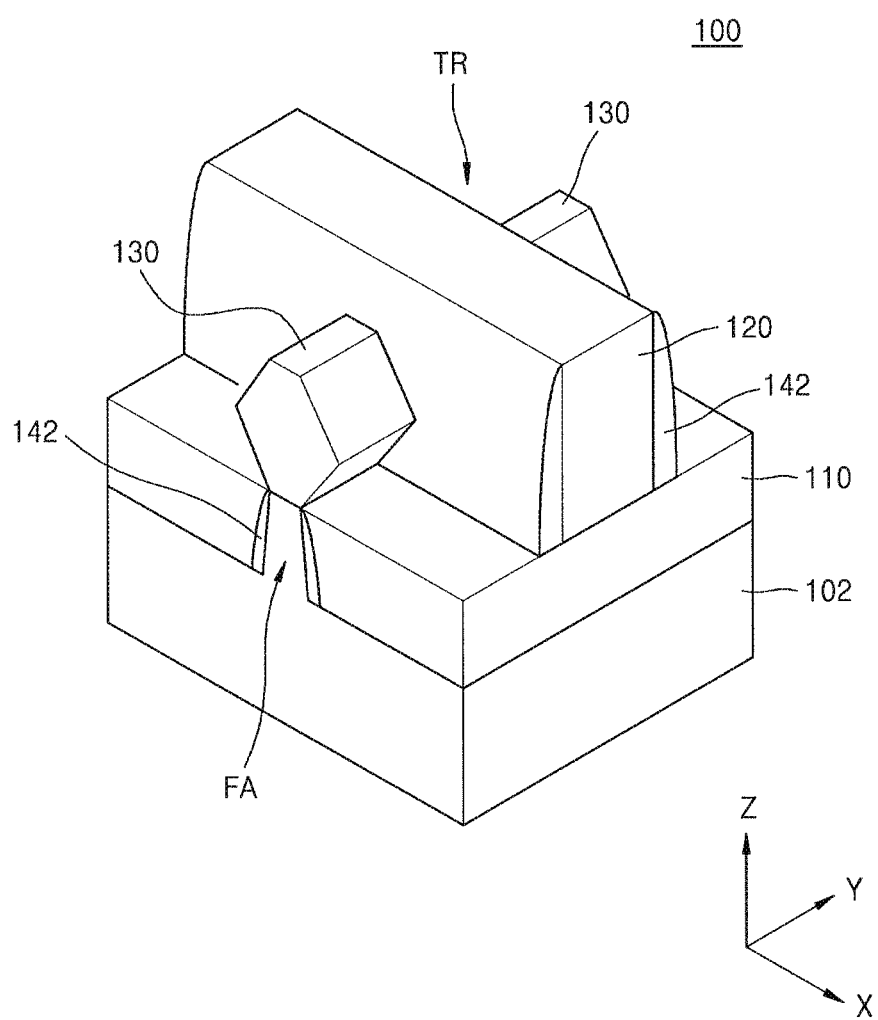
Figure 8C:
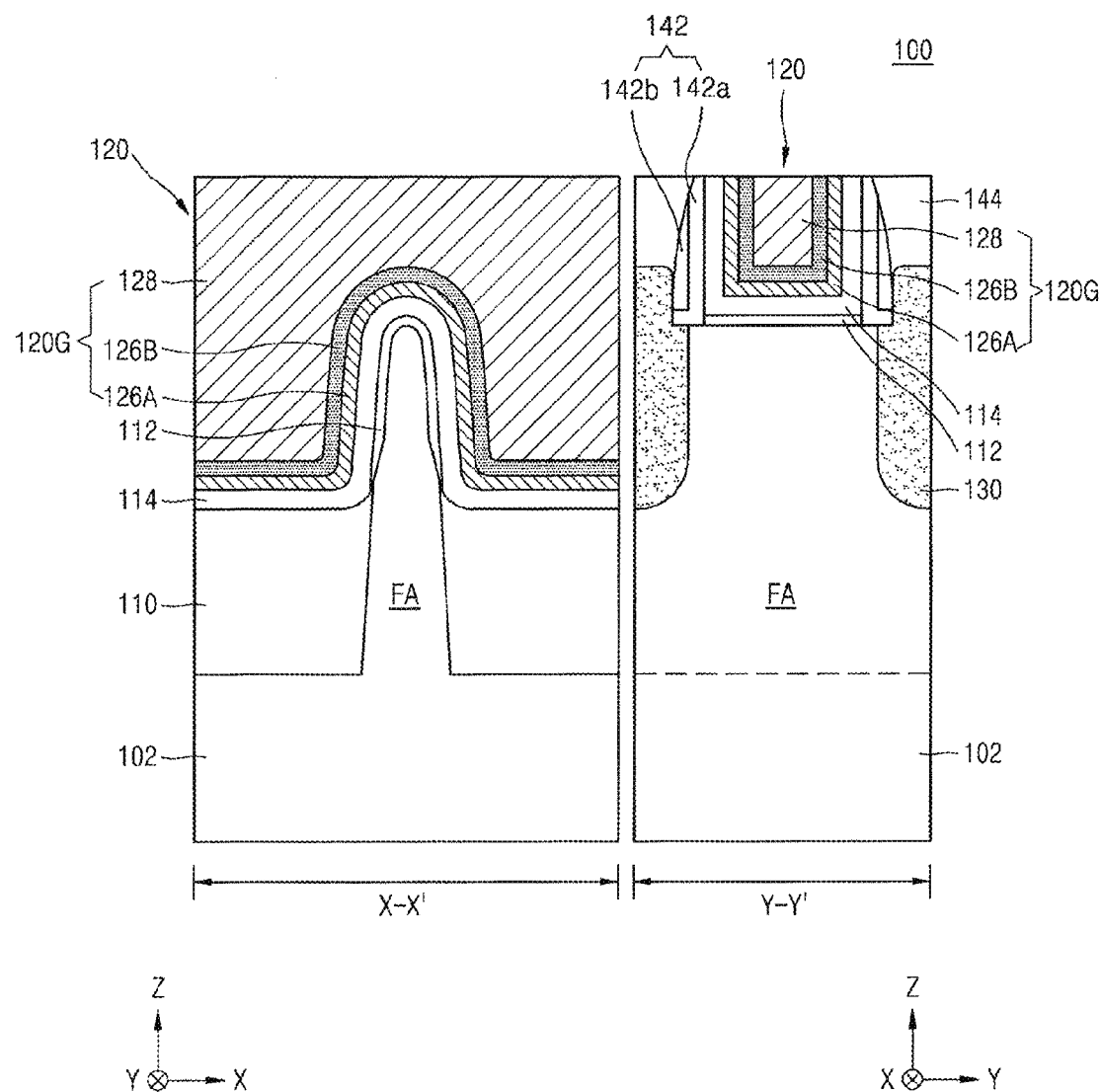

FIGS. 8A to 8C illustrate a semiconductor device 100 including a SiOCN material layer on a semiconductor substrate. FIG. 8A illustrates a plan view of the semiconductor device 100, FIG. 8B illustrates a perspective view of the semiconductor device 100, and FIG. 8C illustrates a lateral cross-sectional view of the semiconductor device 100.

Referring to FIGS. 8A to 8C, the semiconductor device 100 may include a fin-type or fin-shaped active area FA protruding from a substrate 102.

The substrate 102 may be substantially the same as the substrate 11 described above with reference to FIG. 1, and a repeated description of the substrate 102 may be omitted.

The fin-type active area FA may extend in a direction (Y direction in FIGS. 8A and 8B). An isolation layer 110 may be formed on the substrate 102 and may cover a lower sidewall of the fin-type active area FA. The fin-type active area FA may protrude in a fin shape on the isolation layer 110. In an implementation, the isolation layer 110 may include a silicon oxide layer, a silicon nitride layer, a silicon oxynitride layer, or a combination thereof.

On the fin-type active area FA on the substrate 102, a gate structure 120 may extend in a direction (X direction) that intersects an extending direction of the fin-type active area FA. A pair of source/drain regions 130 may be formed on portions of the fin-type active area FA that are on both sides of the gate structure 120.

The source/drain regions 130 may include a semiconductor layer epitaxially grown from the fin-type active area FA. Each of the source/drain regions 130 may have an embedded SiGe structure including a plurality of epitaxially grown SiGe layers, an epitaxially grown Si layer, or an epitaxially grown SiC layer. In an implementation, the source/drain regions 130 have the specific shape illustrated in FIG. 8B. In an implementation, the source/drain regions 130 may have other suitable shapes. For example, the source/drain regions 130 may have any of various cross-sectional shapes such as a circle, an oval, and a polygon.

A MOS transistor TR may be formed at an intersection between the fin-type active area FA and the gate structure 120. The MOS transistor TR may be a three-dimensional (3D) MOS transistor in which a channel may be formed on an upper surface and both lateral surfaces of the fin-type active area FA. The MOS transistor TR may include an NMOS transistor or a PMOS transistor.

As shown in FIG. 8C, the gate structure 120 may include an interface layer 112, a high-dielectric constant layer 114, a first metal-containing layer 126A, a second metal-containing layer 126B, and a gap-fill metal layer 128 that are sequentially formed on a surface of the fin-type active area FA. The first metal-containing layer 126A, the second metal-containing layer 126B, and the gap-fill metal layer 128 of the gate structure 120 may constitute a gate electrode 120G.

Insulation spacers 142 may be provided on both sidewalls of the gate structure 120. The insulation spacers 142 may also be provided as source/drain spacers on sidewalls of portions of the fin-type active area FA on both sides of the gate structure 120.

The insulation spacers 142 may each include, e.g., a SiOCN material layer as described above. In an implementation, the insulation spacers 142 may all be SiOCN material layers. In an implementation, each of the insulation spacers 142 may be a single layer. In an implementation, each of the insulation spacers 142 may be a multi-layer in which at least two material layers are stacked. In an implementation, the insulation spacers 142 may each have a double-layer structure including a SiOCN material layer 142a and a SiN material layer 142b. For example, the SiN material layer 142b may be a thermally deposited SiN material layer. In an implementation, the SiN material layer 142b may be a SiN material layer formed by a thermal deposition process, not by a plasma process.

When the insulation spacers 142 are a double layer including the SiOCN material layer 142a and the SiN material layer 142b that is formed by thermal deposition, the source/drain regions 130 adjacent to the insulation spacers 142 may have fewer defects. For example, when the insulation spacers 142 are a double layer, the source/drain regions 130 including a SiGe layer formed by epitaxial growth may have markedly less defects. This will be described in more detail below in connection with semiconductor device fabrication.

With a sharp reduction in halogen element content in the SiOCN material layer 142a, the SiOCN material layer 142a may have markedly improved etch resistance against an etchant. If a SiOCN material layer that constitutes gate spacers or parts thereof were to have insufficient etch resistance against an etchant, a shoulder region of the gate electrode 120G could be overexposed, so that defects such as nodules could be more likely to occur. However, as described above, the improved etch resistance of the SiOCN material layer 142a may help prevent such overexposure of the shoulder region of the gate electrode 120G, so that defects such as nodules are less likely to occur.

In an implementation, the SiOCN material layer 142a of each of the insulation spacers 142 may have a dielectric constant of, e.g., about 1 to about 8. In an implementation, the SiOCN material layer 142a may have a dielectric constant of about 3.5 to about 5.5, e.g., a dielectric constant of about 3.5 to about 4.8. If the SiOCN material layer 142a were to have a dielectric constant greater than 8, desired electric characteristics might not be provided. In an implementation, the SiOCN material layer 142a could have a dielectric constant less than 3.5, but forming the SiOCN material layer 142a having such a small dielectric constant may not be easy.

In an implementation, in order to have such a low dielectric constant, the SiOCN material layer 142a may include, e.g., about 8 atom % to about 30 atom % of carbon and about 32 atom % to about 50 atom % of oxygen. In an implementation, the carbon content may be about 11 atom % to about 20 atom %. In an implementation, the oxygen content may be about 30 atom % to about 48 atom %. In an implementation, the carbon content may be about 15 atom % to about 20 atom %. In an implementation, the oxygen content may be about 38 atom % to about 48 atom %.

An interlayer insulation layer 144 may be formed on the insulation spacers 142.

The interface layer 112 may be formed on the surface of the fin-type active area FA. The interface layer 112 may be formed of an insulation material, e.g., an oxide layer, a nitride layer, or an oxynitride layer. The interface layer 112 may constitute a gate insulation layer, together with the high-dielectric constant layer 114.

The high dielectric layer 114 may be formed of a material having a higher dielectric constant than a silicon oxide layer. For example, the high-dielectric constant layer 114 may have a dielectric constant of about 10 to about 25. In an implementation, the high dielectric layer 114 may be formed of zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

In an implementation, the first metal-containing layer 126A may include nitride of Ti, nitride of Ta, oxynitride of Ti, or oxynitride of Ta. For example, the first metal-containing layer 126A may be formed of TiN, TaN, TiAlN, TaAlN, TiSiN, or a combination thereof. In an implementation, the first metal-containing layer 126A may be formed via various vapor deposition methods such as ALD, CVD, and PVD.

In an implementation, the second metal-containing layer 126B may be an N-type metal-containing layer necessary for an NMOS transistor including an Al compound containing Ti or Ta. For example, the second metal-containing layer 126B may be formed of TiAlC, TiAlN, TiAlCN, TiAl, TaAlC, TaAlN, TaAlCN, TaAl, or a combination thereof.

In an implementation, the second metal-containing layer 126B may be a P-type metal-containing layer necessary for a PMOS transistor. For example, the second metal-containing layer 126B may include at least one of Mo, Pd, Ru, Pt, TiN, WN, TaN, Ir, TaC, RuN, and MoN.

The second metal-containing layer 126B may be a single layer or multiple layers.

The second metal-containing layer 126B may adjust a work function of the gate structure 120, together with the first metal-containing layer 126A. A threshold voltage of the gate structure 120 may be adjusted by work function adjustments by the first metal-containing layer 126A and the second metal-containing layer 126B. In an implementation, the first metal-containing layer 126A or the second metal-containing layer 126B may be omitted.

When the gate structure 120 is formed using a replacement metal gate (RMG) process, the gap-fill metal layer 128 may be formed to fill a remaining gate space on the second metal-containing layer 126B. When no gate space remains on the second metal-containing layer 126B after the second metal-containing layer 126B is formed, the gap-fill metal layer 128 may not be formed on the second metal-containing layer 126B.

The gap-fill metal layer 128 may include, e.g., W, metal nitride (e.g., TiN or TaN), Al, metal carbide, metal silicide, metal aluminum carbide, metal aluminum nitride, or metal silicon nitride.

An integrated circuit (IC) device including a FinFET having a 3D-structure channel has been described above with reference to FIGS. 8A to 8C. In an implementation, methods of manufacturing IC devices including planar MOSFETs having characteristics according to the embodiments may be provided via various modifications and changes made.

FIGS. 9A to 9F illustrate cross-sectional views of stages in a method of fabricating a semiconductor device, according to an exemplary embodiment. A YY' cross-section and a WW' cross-section in FIGS. 9A to 9F are a YY' cross-section and a WW' cross-section of FIG. 8A, respectively.

Figure 9A:
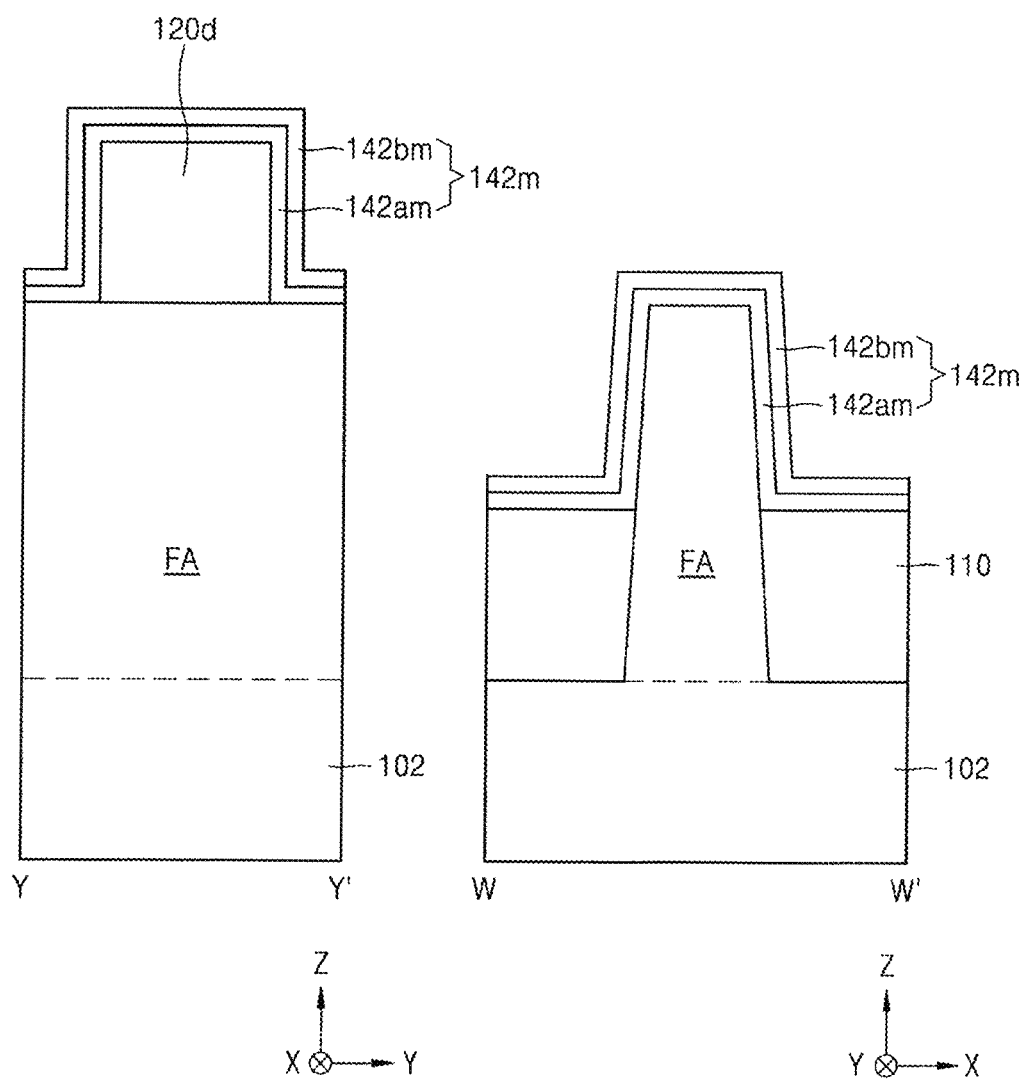
FIGS. 9A to 9F illustrate cross-sectional views of stages in a method of fabricating a semiconductor device, according to an exemplary embodiment.

Referring to FIG. 9A, after a dummy gate electrode 120d is formed on a substrate 102, in which the fin-type active area FA is defined by the isolation layer 110, a gate spacer material layer 142m may be conformally deposited on the substrate 102 and the entire surface of the dummy gate electrode 120d.

The substrate 102 may be substantially the same as the substrate 11 described above with reference to FIG. 1, and a repeated description of the substrate 102 may be omitted.

In an implementation, the dummy gate electrode 120d may be formed of, e.g., polysilicon. The dummy gate electrode 120d may be provided to secure a location and a space where a gate electrode is to be formed.

The gate spacer material layer 142m may include the above-described SiOCN material layer. In an implementation, the gate spacer material layer 142m may include a SiOCN material layer 142am. In an implementation, the gate spacer material layer 142m may be a single SiOCN material layer. In an implementation, the gate spacer material layer 142m may be a multi-material layer in which at least two materials layers including SiOCN are stacked. In an implementation, the gate spacer material layer 142m may include the SiOCN material layer 142am and a SiN material layer 142bm on the SiOCN material layer 142am.

A method of forming the SiOCN material layer 142am has been described above with reference to FIGS. 2 to 5, and thus an additional description thereof may be omitted.

In an implementation, the SiN material layer 142bm may be formed by thermal decomposition or excitation reaction of precursor(s) without using plasma. The SiN material layer 142bm may be formed by, e.g., CVD, ALD, or like.

Figure 9B:
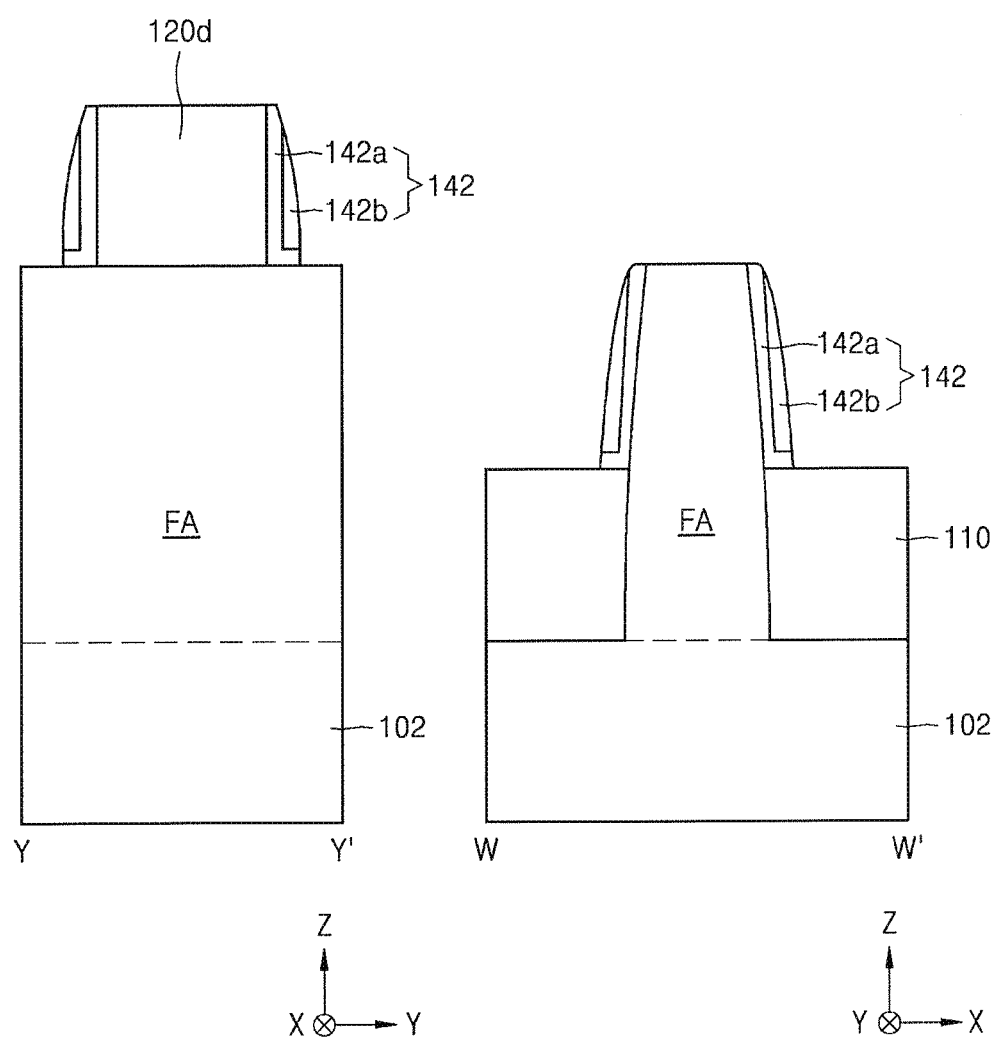

Referring to FIG. 9B, the gate spacer material layer 142m may be anisotropically etched to form gate spacers 142. The gate spacers 142 may be formed on sidewalls of the dummy gate electrode 120d. The gate spacers 142 may be formed on sidewalls of a fin-type active area FA that are on both sides of the dummy gate electrode 120d.

The anisotropic etching may partially expose a SiOCN material layer 142a at a lower region of the gate spacers 142. The SiOCN material layer 142a may also be partially exposed at an upper region of the gate spacers 142.

In an implementation, after only the SiOCN material layer 142am is conformally formed, the SiOCN material layer 142am may be anisotropic etched to form the SiOCN material layer 142a. Next, the SiN material layer 142bm may be conformally formed on the SiOCN material layer 142a, and then anisotropically etched, to thereby form the gate spacers 142. In this case, the SiOCN material layer 142a may not be exposed at a lower or upper region of the gate spacers 142.

Figure 9C:
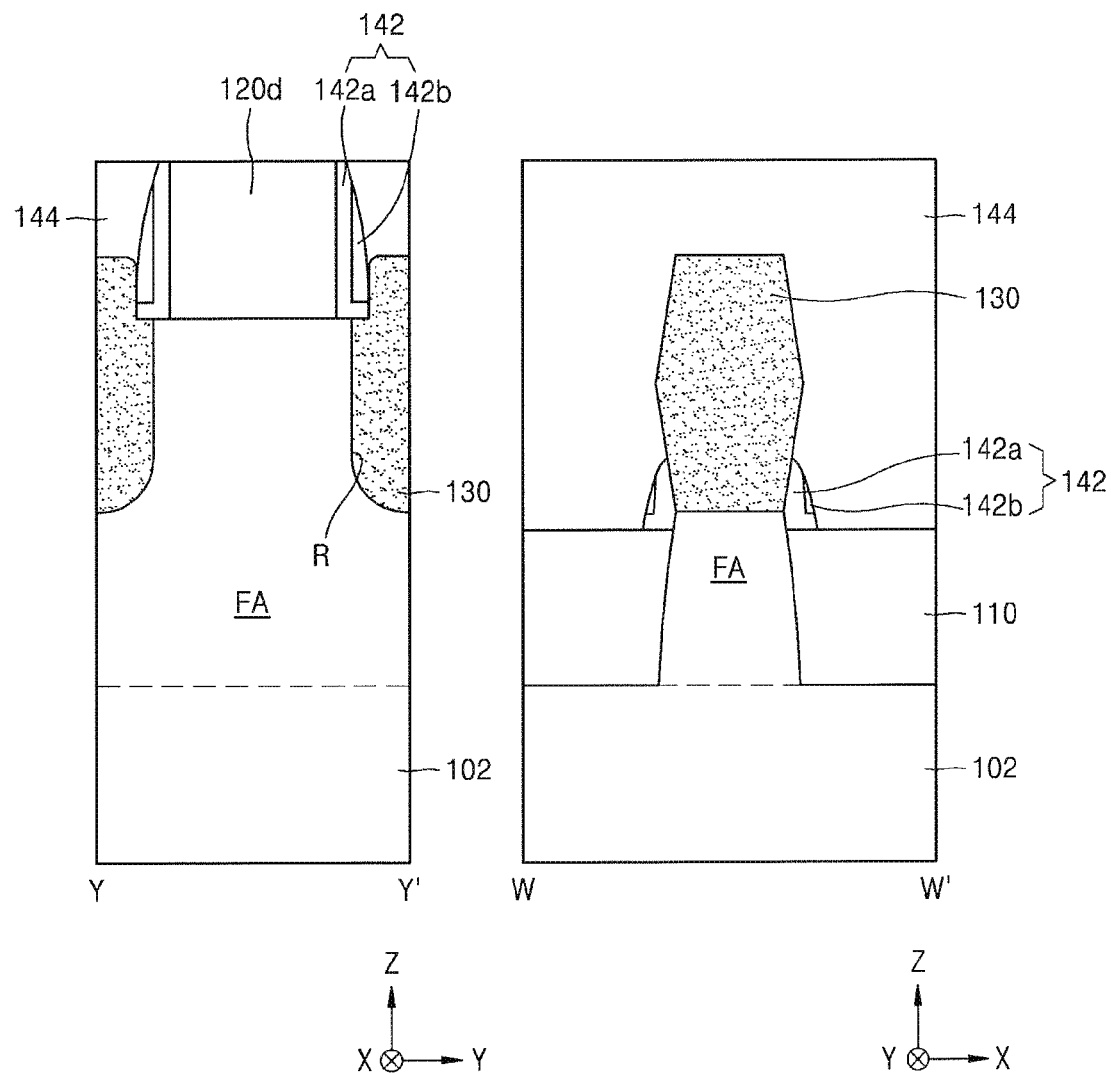

Referring to FIG. 9C, the fin-type active area FA may be partially removed by an etching process with the dummy gate electrode 120d and the gate spacers 142 as an etch mask.

Anisotropic etching and/or isotropic etching may be performed to partially remove the fin-type active area FA. For example, to expose at least a portion of lower surfaces of the gate spacers 142 formed on sidewalls of the dummy gate electrode 120d, partial etching may be performed with a combination of anisotropic etching and isotropic etching.

For example, an exposed portion of the fin-type active area FA may be anisotropically etched to a predetermined depth, and then isotropic etching may be performed by wet etching. For example, an NH$_4$OH solution, a trimethyl ammonium hydroxide (TMAH) solution, an HF solution, an NH$_4$F solution, or a mixture thereof may be used as an etchant for the wet etching.

A recess may be formed by anisotropic etching using the gate spacers 142 as an etch mask and may undergo the wet etching to thereby obtain a recess R via which the portions of the lower surfaces of the gate spacers 142 are exposed, as shown in FIG. 9C. For example, the recess R may expose at least portions of lower surfaces of the gate spacers 142 that are adjacent to a region to be an impurity region.

In an implementation, the wet etching for exposing the portions of the lower surfaces of the gate spacers 142 may be omitted.

Then, a source/drain material layer may be formed within the recess R to form an impurity region 130. In an implementation, the source/drain material layer may be formed of, e.g., Si, SiC, or SiGe. The source/drain material layer may be formed by, e.g., epitaxial growth. Impurities may be injected in situ during epitaxial growth of the source/drain material layer. The impurities may be injected by ion implantation after the source/drain material layer is formed. The impurity region 130 may have an upper surface that is higher than an upper surface of the fin-type active area FA.

If a halogen element content in the SiOCN material layer 142a were to be high, halogen elements near a surface of the SiOCN material layer 142a could migrate to a surface of the recess R. The halogen elements, e.g., chlorine (Cl), present in the surface of the recess R could then hinder epitaxial growth of a SiGe material layer and consequentially cause an undesirable defect.

A SiOCN material layer and a semiconductor device each having fewer defects and improved reliability may be manufactured using any of the methods according to the above-described embodiments.

Figure 10:
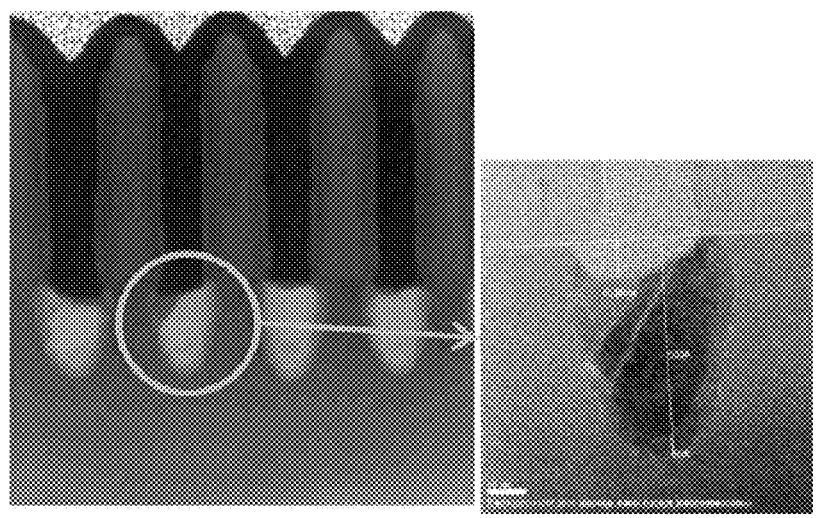
FIG. 10 illustrates an image showing a defect in a SiGe material layer caused by a halogen element in a semiconductor device including no SiN material layer.

FIG. 10 illustrates an image showing a defect in a SiGe material layer caused by a halogen element in a semiconductor device including no SiN material layer. Referring to FIG. 10, partial defective growth of SiGe is shown in a circled region. Referring to a magnified image of the circled region, no SiGe is grown in a left upper region of the recess R.

However, when the SiN material layer 142b is further formed on the SiOCN material layer 142a, migration of a halogen element into the recess R may be suppressed, so that defective growth of the SiGe material layer as shown in FIG. 10 may be prevented.

Referring back to FIG. 9C, an interlayer insulation layer 144 may be formed on the upper surface of the impurity region 130. In an implementation, the interlayer insulation layer 144 may be formed of, e.g., silicon oxide.

Figure 9D:
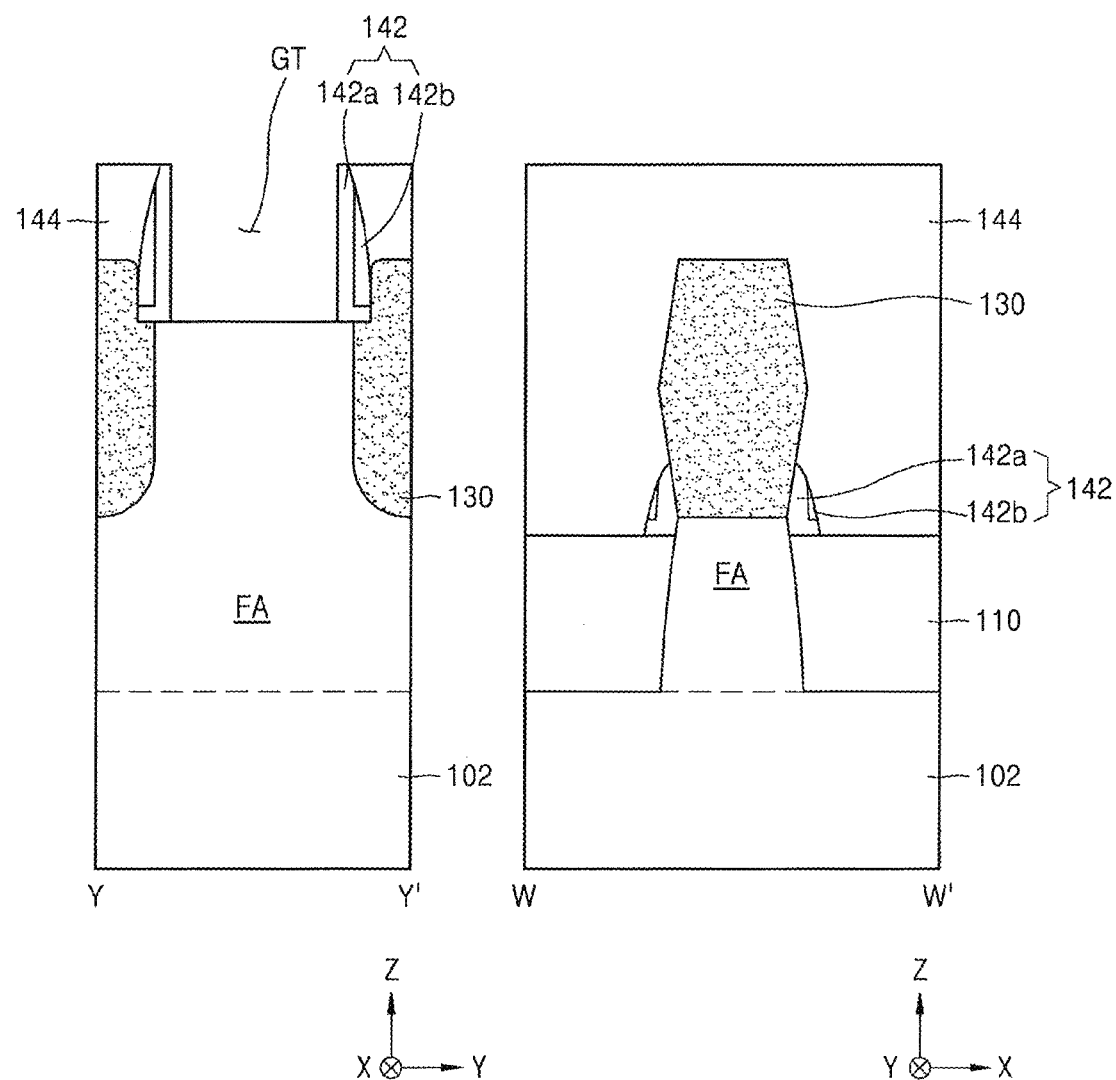

Referring to FIG. 9D, the dummy gate electrode 120d may be removed to form a gate trench GT. An upper surface of the substrate 102 may be partially exposed via the gate trench GT. The portion of the semiconductor substrate 102, exposed via the gate trench GT, may correspond to a channel region of the semiconductor device that is to be formed later.

The dummy gate electrode 120d may be removed by, e.g., dry etching or wet etching.

Figure 9E:
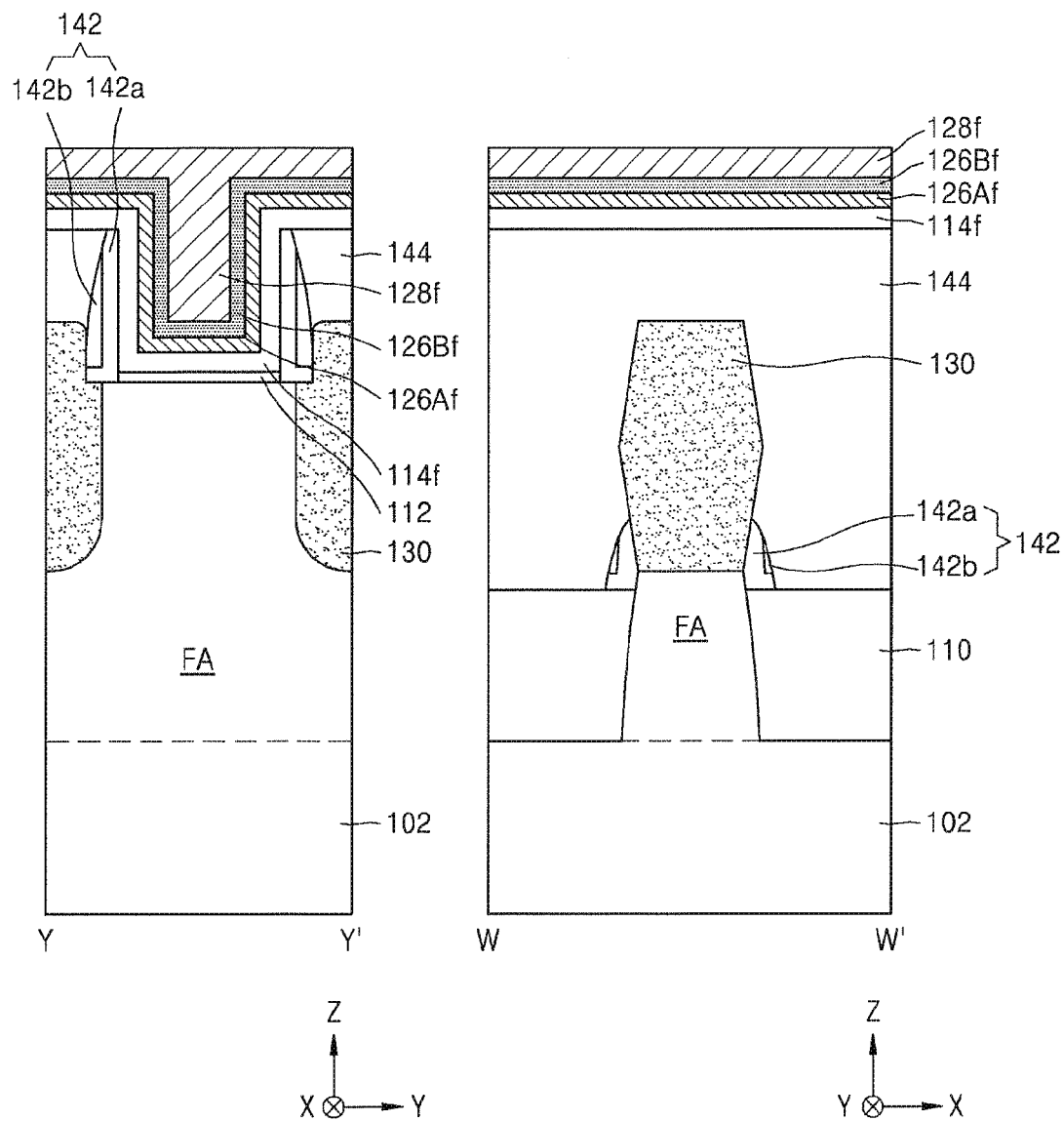

Referring to FIG. 9E, an interface layer 112 may be formed. Then, a high-dielectric constant material layer 114f, a first metal-containing material layer 126Af, a second metal-containing material layer 126Bf, and a gap-fill metal material layer 128f may be sequentially formed on an upper surface of the interface layer 112, the sidewalls of the gate trench GT, and the upper surface of the interlayer insulation layer 144. For example, the high-dielectric constant material layer 114f, the first metal-containing material layer 126Af, and the second metal-containing material layer 126Bf may be conformally formed along the upper surface, the sidewalls, and the upper surface of the gate trench GT. The gap-fill metal material layer 128f may be formed to fill a trench formed by the second metal-containing material layer 126Bf.

The high-dielectric constant material layer 114f, the first metal-containing material layer 126Af, the second metal-containing material layer 126Bf, and the gap-fill metal material layer 128f may be each independently formed by, e.g., ALD, CVD, or PVD.

Figure 9F:
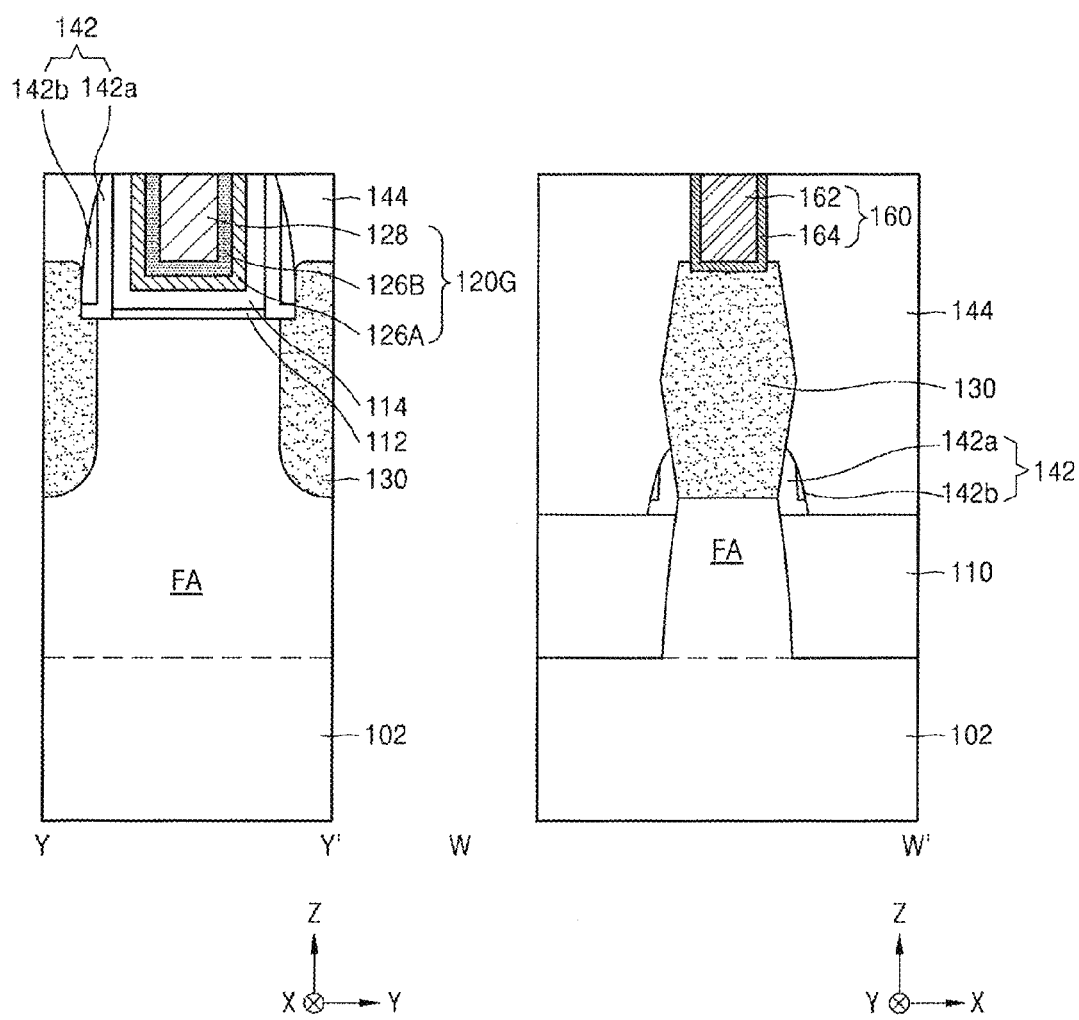

Referring to FIG. 9F, a resultant structure may be planarized until the upper surface of the interlayer insulation layer 144 is exposed, thereby obtaining a final semiconductor device 100. The planarization may be performed by, e.g., chemical mechanical polishing (CMP).

A contact 160 may be connected to an upper surface of the impurity region 130 that forms the source/drain regions. The contact 160 may include a conductive barrier layer 164 and a wiring layer 162. In an implementation, the conductive barrier layer 164 may be formed of, e.g., titanium nitride, tantalum nitride, tungsten nitride, titanium carbon nitride, or a combination thereof. In an implementation, the wiring layer 162 may be formed of, e.g., a doped semiconductor, metal (such as, Cu, Ti, W, or Al), metal silicide (such as nickel silicide, cobalt silicide, tungsten silicide, or tantalum silicide), or a combination thereof. The gate electrode 120G and the contact 160 may be electrically insulated from each other by the interlayer insulation layer 144.

In an implementation, the source/drain region may be an impurity region having a raised source/drain (RSD) structure, as illustrated in FIGS. 8A to 8C and FIGS. 9A to 9F. In an implementation, the impurity region 130 may be an impurity-doped region formed in an area corresponding to the fin-type active area FA.

Figure 11A:
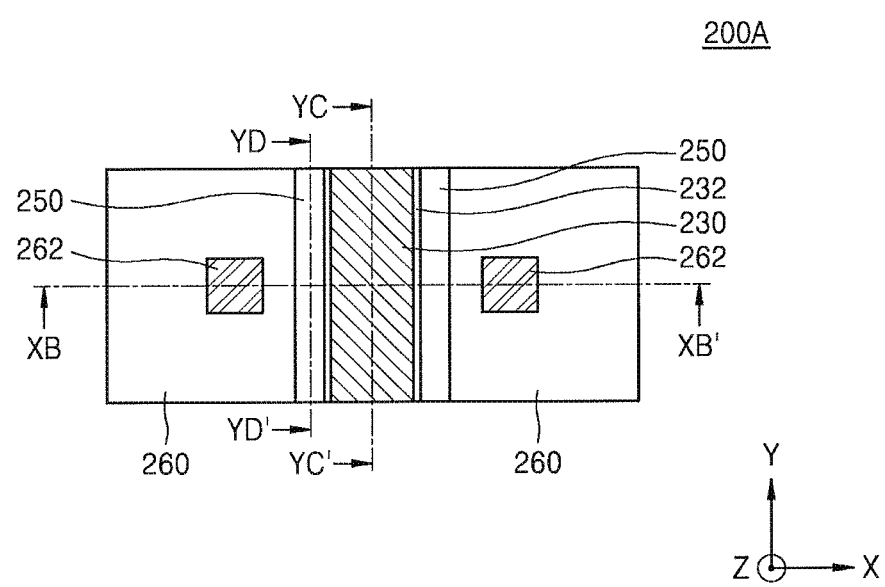
FIGS. 11A to 11D illustrate views showing parts of a semiconductor device according to embodiments.
Figure 11B:
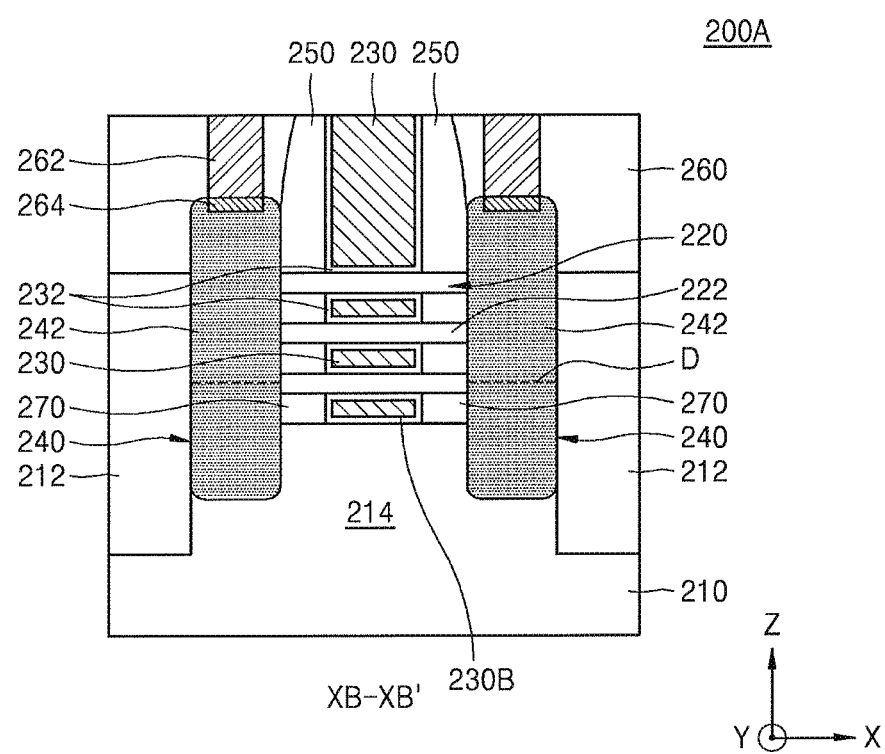
Figure 11C:
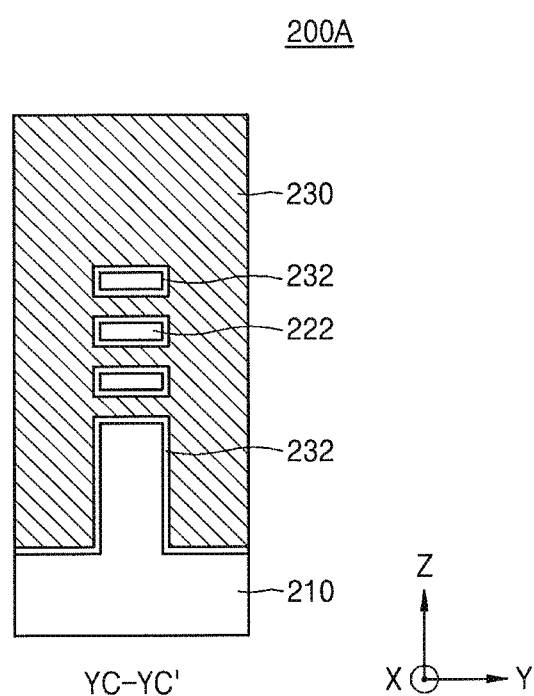
Figure 11D:
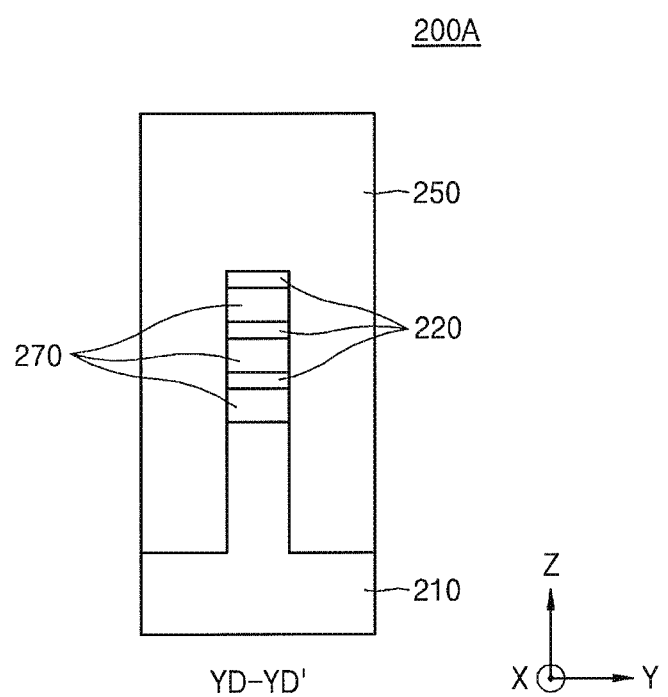

FIGS. 11A to 11D are cross-sectional views of parts of a semiconductor device 200A, according to embodiments. For example, FIG. 11A illustrates a plan view of the semiconductor device 200A, FIG. 11B illustrates a cross-sectional view taken along line XB-XB' of FIG. 11A, FIG. 11C illustrates a cross-sectional view taken along line YC-YC' of FIG. 11A, and FIG. 11D illustrates a cross-sectional view taken along line YD-YD' of FIG. 11A.

Referring to FIGS. 11A to 11D, the semiconductor device 200A may include a substrate 210, a nanowire 220 extending in a direction (X direction) parallel to an extending direction of the main surface of the substrate 210 at a location spaced apart from the substrate 210, and a gate 230 surrounding at least a portion of the nanowire 220.

In an implementation, the substrate 210 may be a silicon substrate. In an implementation, the substrate 210 may construct a device selected from a system large scale integration (LSI), a logic circuit, an image sensor such as a CMOS image sensor (CIS), a memory device (such as, a flash memory, DRAM, SRAM, EEPROM, PRAM, MRAM, or RRAM), and a micro-electro-mechanical system (MEMS).

An active area 214 is defined in the substrate 210 by an isolation layer 212. A plurality of wells may be formed in the active area 214 of the substrate 210.

The nanowire 220 may include a channel region 222. The gate 230 may surround at least a portion of the channel region 222.

In an implementation, the nanowire 220 may be formed of a Group IV element-containing semiconductor, a Group IV and IV elements-containing compound semiconductor, or a Group III and V elements-containing compound semiconductor. In an implementation, the nanowire 220 may be formed of Si, Ge, or SiGe. In an implementation, the nanowire 220 may be formed of InGaAs, InAs, GaSb, InSb, or a combination thereof.

A gate dielectric layer 232 may be between the channel region 222 and the gate 230.

In an implementation, the gate dielectric layer 232 may include a silicon oxide layer, a silicon oxynitride layer, a high-dielectric constant layer having a higher dielectric constant than a silicon oxide layer, or a combination thereof. For example, a high-dielectric constant layer that is usable as the gate dielectric layer 232 may be formed of $HfO_2$, HfSiO, HfSiON, HfTaO, HMO, HfZrO, zirconium oxide, aluminum oxide, an $HfO_2$—$Al_2O_3$ alloy, or a combination thereof.

In an implementation, the gate 230 may include doped polysilicon, metal, or a combination thereof. For example, the gate 230 may be formed of Al, Cu, Ti, Ta, W, Mo, TaN, NiSi, CoSi, TiN, WN, TiAl, TiAlN, TaCN, TaC, TaSiN, or a combination thereof.

A pair of semiconductor layers 240 extending to both ends of the nanowire 220 along a direction (Z direction) perpendicular to a main surface of the substrate 210 may be formed on the substrate 210. In an implementation, the semiconductor layers 240 may each include a SiGe layer, a Ge layer, a SiC layer, or an InGaAs layer.

The semiconductor layers 240 may be semiconductor layers regrown from the substrate 210 and the nanowire 220 by using an epitaxy process. In an implementation, the semiconductor layers 240 may be formed of a material different from the materials of the substrate 210 and the nanowire 220.

A source/drain region 242 may be included in each of the semiconductor layers 240. The source/drain region 242 may be formed by injecting N-type impurity ions or P-type impurity ions into the semiconductor layer 240. The source/drain region 242 may be formed to a depth D indicated by a dashed line. For example, the source/drain region 242 may include a doped SiGe layer, a doped Ge layer, a doped SiC layer, or an doped InGaAs layer.

In an implementation, the depth D may be a level higher than a lower surface 230B of the gate 230 that is closest to the substrate 210, as shown in FIG. 11B.

The source/drain regions 242 formed within the semiconductor layers 240 may contact both ends of the nanowire 220 and extend to a level higher than the nanowire 220 along the direction (Z direction) perpendicular to the main surface of the substrate 210.

Both ends of the nanowire 220 adjacent to the source/drain regions 242 may be covered with outer insulation spacers 250 that may cover sidewalls of the gate 230.

In an implementation, the outer insulation spacers 250 may each include the above-described SiOCN material layer. In an implementation, the outer insulation spacers 250 may each include a SiOCN material layer. In an implementation, the outer insulation spacers 250 may each include a SiOCN single material layer. In an implementation, the outer insulation spacers 250 may each include a multi-material layer in which at least two materials layers including SiOCN are stacked.

In an implementation, the SiOCN material layer of each of the outer insulation spacers 250 may have a dielectric constant of no less than 1 and less than 5.5. In an implementation, the SiOCN material layer of each of the outer insulation spacers 250 may have a dielectric constant of about 3.5 to about 5.5. In an implementation, the SiOCN material layer of each of the outer insulation spacers 250 may have a dielectric constant of no less than 1 and less than 4.4.

In an implementation, in order to have such a low dielectric constant, the SiOCN material layer may include, e.g., about 8 atom % to about 30 atom % of carbon and about 32 atom % to about 50 atom % of oxygen. In an implementation, the carbon content may be about 11 atom % to about 20 atom %. In an implementation, the oxygen content may be about 30 atom % to about 48 atom %. In an implementation, the carbon content may be about 15 atom % to about 20 atom %. In an implementation, the oxygen content may be about 38 atom % to about 48 atom %.

A portion of the source/drain region 242 and a portion of the outer insulation spacer 250 may be covered with an insulation layer 260. The source/drain regions 242 may be connected to contacts 262 that may penetrate through the insulation layer 260. Metal silicide layers 264 may be formed between the source/drain regions 242 and the contacts 262. The formation of the metal silicide layers 264 on surfaces of the source/drain regions 242 may reduce resistance of the source/drain regions 242 and resistance of the contacts 262. In an implementation, the metal silicide layers 264 may include, e.g., a cobalt silicide layer. In an implementation, the metal silicide layers 264 may be omitted.

A pair of inner insulation spacers 270 may be formed between the substrate 210 and the nanowire 220. The inner insulation spacers 270 may be between the gate 230 and the source/drain regions 242. The inner insulation spacers 270 may be formed of a different material from the material of the gate dielectric layer 232.

The gate dielectric layer 232 may extend from a surface of the channel region 222 of the nanowire 220 to sidewalls of the inner insulation spacers 270 between the substrate 210 and the nanowire 220 such that the gate dielectric layer 232 may be between the gate 230 and the inner insulation spacers 270.

In an implementation, the inner insulation spacers 270 may be formed of a material different from the material of the gate dielectric layer 232. In an implementation, the inner insulation spacers 270 may be formed of a material having a dielectric constant less than that of the material of the gate dielectric layer 232. In an implementation, the inner insulation spacers 270 may each be formed of an oxide of a Group IV element-containing semiconductor, an oxide of a Group IV and IV elements-containing compound semiconductor, an oxide of a Group III and V elements-containing compound semiconductor, or silicon oxide. For example, the inner insulation spacers 270 may each be formed of an oxide of SiGe, an oxide of InP, or a silicon oxide.

The outer insulation spacers 250 and the inner insulation spacers 270 may be spaced apart from each other in the direction (Z direction) perpendicular to the extending direction of the main surface of the substrate 210 and may overlap with each other in the perpendicular direction. In an implementation, the inner insulation spacers 270 may be formed of a material different from the material of the outer insulation spacers 250. In an implementation, the inner insulation spacers 270 may be formed of a material having a dielectric constant less than that of the material of the outer insulation spacers 250.

The semiconductor device 200A may constitute a transistor. In an implementation, when an N-type well is formed in the active area 214 of the substrate 210 and the source/drain regions 240 are doped with P-type impurities, the semiconductor device 200A may constitute a PMOS transistor. In an implementation, when a P-type well is formed in the active area 214 of the substrate 210 and the source/drain regions 240 are doped with N-type impurities, the semiconductor device 200A may constitute an NMOS transistor.

A carrier mobility of a MOS transistor may greatly affect power consumption and switching performance of a device. By improving the carrier mobility, a switching speed may be increased and an operation at a low voltage may also be possible, and thus the power consumption may be reduced. In an implementation, in order to improve the carrier mobility of the semiconductor device 200A that constitutes a MOS transistor, the channel region 222 of the nanowire 220 may have a strained channel.

For example, when the semiconductor device 200A constitutes a PMOS transistor, to provide a nanowire 220 having a strained channel, the nanowire 220 may be formed of Si and the source/drain regions 242 connected to both ends of the nanowire 220 may be formed of doped SiGe or doped Ge. As another example, when the semiconductor device 200A constitutes a PMOS transistor, to provide a nanowire 220 having a strained channel, the nanowire 220 may be formed of Ge and the source/drain regions 242 may be formed of SiGe. As another example, when the semiconductor device 200A constitutes an NMOS transistor, to provide a nanowire 220 having a strained channel, the nanowire 220 may be formed of Si and the source/drain regions 242 may be formed of doped SiC.

By way of summation and review, a source material for forming a SiOCN material layer may adversely affect growth of other regions in the semiconductor device, e.g., epitaxial growth of source/drain regions. If a SiOCN material layer were to have insufficient etch resistance against an etchant, a gate electrode could be excessively exposed, causing a defect.

The embodiments may provide a method of forming a SiOCN material layer with fewer defects and improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a SiOCN material layer, the method comprising:
   supplying a silicon source onto a substrate;
   supplying a carbon source onto the substrate;
   supplying an oxygen source onto the substrate; and
   supplying a nitrogen source onto the substrate,
   wherein the silicon source includes a non-halogen silylamine, a silane compound, or a mixture thereof,
   wherein the non-halogen silylamine includes a monosilylamine, a disilylamine, a disilylmethylamine, a disilylethylamine, a disilylisopropylamine, a disilyl-tert-butylamine, a tetrasilyldiamine, a diethylsilylamine, a diisopropylsilylamine, a di-tert-butylsilylamine, a bis(trimethylsilyl)amine, a bis(triethylsilyl)amine, or a mixture thereof,
   wherein the silane compound is a material represented by one of the following formulae:

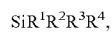

$SiR^1R^2R^3R^4$,

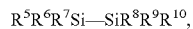

$R^5R^6R^7Si-SiR^8R^9R^{10}$, wherein, in the above formulae:
   $R^1$, $R^2$, $R^3$, and $R^4$ are each independently hydrogen, a hydroxyl group, a C1-C10 alkyl group, a C1-C10 alkoxy group, a C2-C10 alkenyl group, a C2-C10 alkynyl group, a C6-C10 aryl group, a C1-C10 monoalkylamino group, a C1-C10 dialkylamino group, or a C1-C10 trialkylamino group, and all of $R^1$, $R^2$, $R^3$, and $R^4$ are not hydrogen at the same time, and
   $R^5$, $R^6$, $R^7$, $R^8$, $R^9$, and $R^{10}$ are each independently hydrogen, a hydroxyl group, a C1-C10 alkyl group, a C1-C10 alkoxy group, a C2-C10 alkenyl group, a C2-C10 alkynyl group, a C6-C10 aryl group, a C1-C10 monoalkylamino group, a C1-C10 dialkylamino group, or a C1-C10 trialkylamino group, and all of $R^5$, $R^6$, $R^7$, $R^8$, $R^9$, and $R^{10}$ are not hydrogen at the same time.

2. The method as claimed in claim 1, wherein:
   the silicon source includes the non-halogen silylamine.

3. The method as claimed in claim 1, wherein:
   the silicon source includes the silane compound.

4. The method as claimed in claim 1, wherein the silicon source has a molecular weight of about 45 to about 500.

5. The method as claimed in claim 1, further comprising supplying hydrogen onto the substrate.

6. The method as claimed in claim 5, wherein supplying hydrogen onto the substrate is performed at a temperature of about 400° C. to about 700° C.

7. The method as claimed in claim 1, wherein the SiOCN material layer has a halogen ion concentration of 0 atom % to about 0.2 atom %.

8. A method of fabricating a semiconductor device, the method comprising:
   defining a fin-shaped active region on a semiconductor substrate such that the fin-shaped active region protrudes on the semiconductor substrate and extends in a first direction;
   forming a gate electrode such that the gate electrode surrounds both sidewalls and an upper surface of the fin-shaped active region and extends in a direction intersecting the first direction;
   forming a gate spacer on side walls of the gate electrode; and
   forming impurity regions on both sides of the gate electrode,
   wherein forming the gate spacer includes forming a SiOCN material layer using a non-halogen silylamine, a silane compound, or a mixture thereof as a silicon source.

9. The method as claimed in claim 8, wherein forming the SiOCN material layer includes:
   supplying the silicon source onto the semiconductor substrate;

supplying a carbon source onto the semiconductor substrate;
supplying an oxygen source onto the semiconductor substrate; and
supplying a nitrogen source onto the semiconductor substrate.

10. The method as claimed in claim 9, wherein:
the silicon source is silyl amine,
the silicon source is the same as the nitrogen source, and
supplying the silicon source onto the semiconductor substrate and supplying nitrogen source onto the semiconductor substrate are performed at the same time.

11. The method as claimed in claim 9,
wherein the silicon source is a silane compound having a structure represented by one of the following formulae:

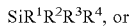

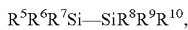

wherein, in the above formulae, $R^1$, $R^2$, $R^3$, $R^4$, $R^5$, $R^6$, $R^7$, $R^8$, $R^9$, and $R^{10}$ are each independently hydrogen, a hydroxyl group, a C1-C10 alkyl group, a C1-C10 alkoxy group, a C2-C10 alkenyl group, a C2-C10 alkynyl group, a C6-C10 aryl group, a C1-C10 monoalkylamino group, a C1-C10 dialkylamino group, or a C1-C10 trialkylamino group; all of $R^1$, $R^2$, $R^3$, and $R^4$ are not hydrogen at the same time; and all of $R^5$, $R^6$, $R^7$, $R^8$, $R^9$, and $R^{10}$ are not hydrogen at the same time,
wherein the silicon source is the same as the carbon source, and
wherein supplying the silicon source onto the semiconductor substrate and supplying the carbon source onto the semiconductor substrate are performed at the same time.

12. The method as claimed in claim 8, wherein forming the gate spacer further includes forming a SiN material layer on the SiOCN material layer after the forming of the SioCN material layer.

13. The method as claimed in claim 8, wherein the SiOCN material layer has a dielectric constant of about 1 to about 5.5.

14. The method as claimed in claim 9, wherein:
forming the SiOCN material layer further includes supplying hydrogen onto the semiconductor substrate,
supplying the silicon source onto the semiconductor substrate, supplying the carbon source onto the semiconductor substrate, supplying the oxygen source onto the semiconductor substrate, and supplying the nitrogen source onto the semiconductor substrate form a deposition cycle, and
supplying hydrogen onto the semiconductor substrate is performed after the deposition cycle is performed two or more times.

15. A method of fabricating a semiconductor device, the method comprising:
forming active region on a semiconductor substrate;
forming a gate electrode on the active region;
forming a gate spacer on side walls of the gate electrode; and
forming impurity regions on both sides of the gate electrode,
wherein forming the gate spacer includes forming a SiOCN material by:
supplying a silicon source onto the substrate; and
supplying an oxygen source onto the substrate; and
wherein the silicon source includes a non-halogen silylamine, a silane compound, or a mixture thereof, provided that the silicon source does not include bis(tertiary-butylamino)silane.

16. The method as claimed in claim 15, wherein forming the gate spacer further includes supplying a nitrogen source onto the substrate, the nitrogen source being different from the silicon source.

17. The method as claimed in claim 15, wherein forming the gate spacer further includes supplying a carbon source onto the substrate, the carbon source being different from the silicon source.

18. The method as claimed in claim 15, wherein:
forming the gate spacer further includes:
supplying a nitrogen source onto the substrate, and
supplying a carbon source onto the substrate,
the nitrogen source is different from the silicon source, and
the carbon source is different from the silicon source.

19. A semiconductor device prepared according to the method as claimed in claim 15.

* * * * *